(12) United States Patent
Hsu et al.

(10) Patent No.: US 12,494,446 B2
(45) Date of Patent: Dec. 9, 2025

(54) PACKAGE STRUCTURES AND METHODS OF MANUFACTURING THE SAME

(71) Applicant: Advanced Semiconductor Engineering, Inc., Kaohsiung (TW)

(72) Inventors: An-Hsuan Hsu, Kaohsiung (TW); Chin-Li Kao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 630 days.

(21) Appl. No.: 17/891,949

(22) Filed: Aug. 19, 2022

(65) Prior Publication Data

US 2024/0063159 A1 Feb. 22, 2024

(51) Int. Cl.
*H01L 25/065* (2023.01)
*H01L 23/00* (2006.01)
*H01L 23/498* (2006.01)

(52) U.S. Cl.
CPC ........ *H01L 24/08* (2013.01); *H01L 23/49811* (2013.01); *H01L 23/49838* (2013.01); *H01L 24/32* (2013.01); *H01L 24/83* (2013.01); *H01L 25/0657* (2013.01); *H01L 2224/05541* (2013.01); *H01L 2224/05556* (2013.01); *H01L 2224/05605* (2013.01); *H01L 2224/05647* (2013.01); *H01L 2224/08145* (2013.01); *H01L 2224/08221* (2013.01); *H01L 2224/08503* (2013.01); *H01L 2224/32145* (2013.01); *H01L 2224/32221* (2013.01); *H01L 2224/80098* (2013.01); *H01L 2224/80815* (2013.01); *H01L 2224/80895* (2013.01); *H01L 2224/83098* (2013.01); *H01L 2225/06524* (2013.01); *H01L 2225/06527* (2013.01); *H01L 2225/06589* (2013.01); *H01L 2924/35121* (2013.01)

(58) Field of Classification Search
CPC .......... H01L 23/49811; H01L 25/0657; H01L 24/08; H01L 24/83
See application file for complete search history.

(56) References Cited

U.S. PATENT DOCUMENTS

| | | | |
|---|---|---|---|
| 6,297,063 B1 * | 10/2001 | Brown | H01L 25/50 257/E21.705 |
| 2012/0001153 A1 * | 1/2012 | Hersee | B82Y 10/00 977/762 |
| 2017/0162536 A1 * | 6/2017 | Arvin | H01L 24/05 |

* cited by examiner

*Primary Examiner* — Dale E Page
*Assistant Examiner* — Wilner Jean Baptiste
(74) *Attorney, Agent, or Firm* — FOLEY & LARDNER LLP

(57) ABSTRACT

A package structure is disclosed. The package structure includes a substrate including a conductive element and a plurality of wires having a surface area through which heat of the conductive element can be dissipated, lowering a bonding temperature of the conductive element. The package structure also includes a conductive layer disposed between the conductive element of the substrate and the plurality of wires. The conductive contact layer attaches the plurality of wires over the conductive element.

19 Claims, 24 Drawing Sheets

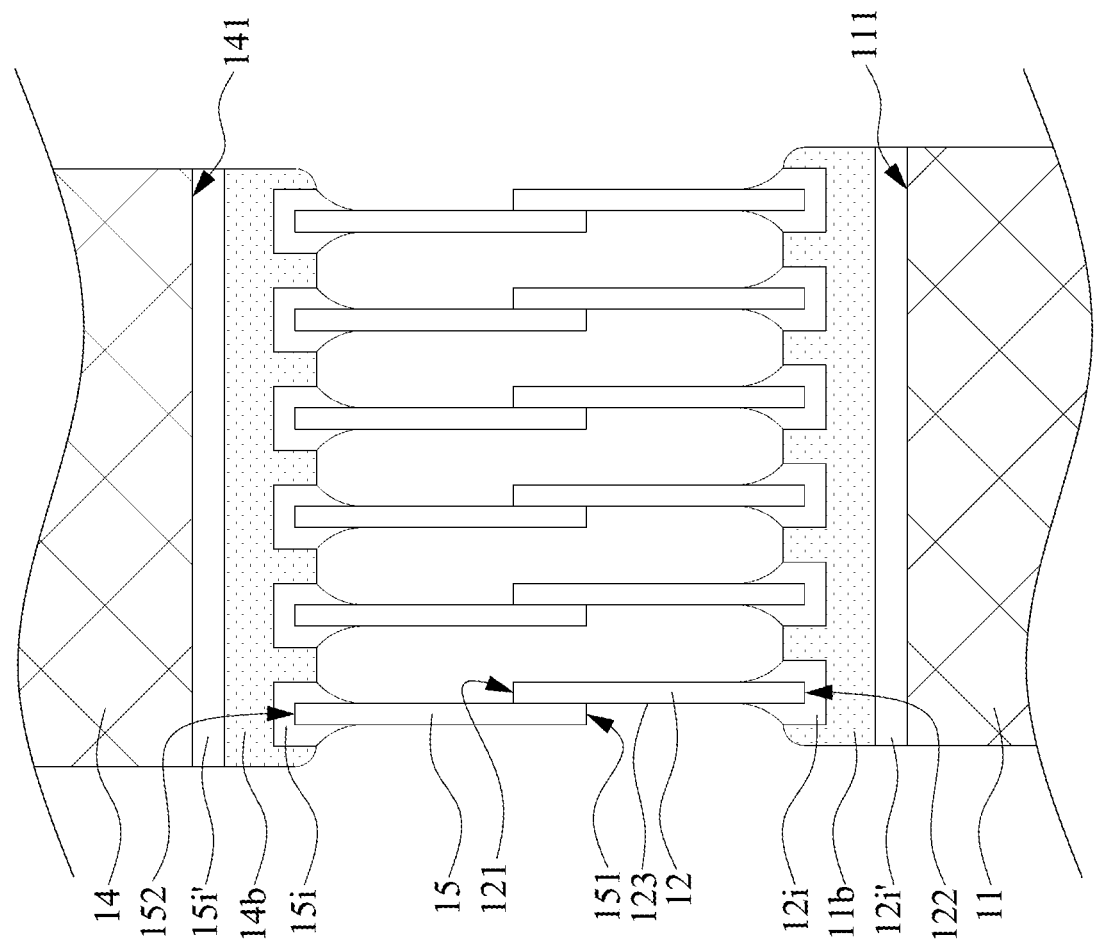

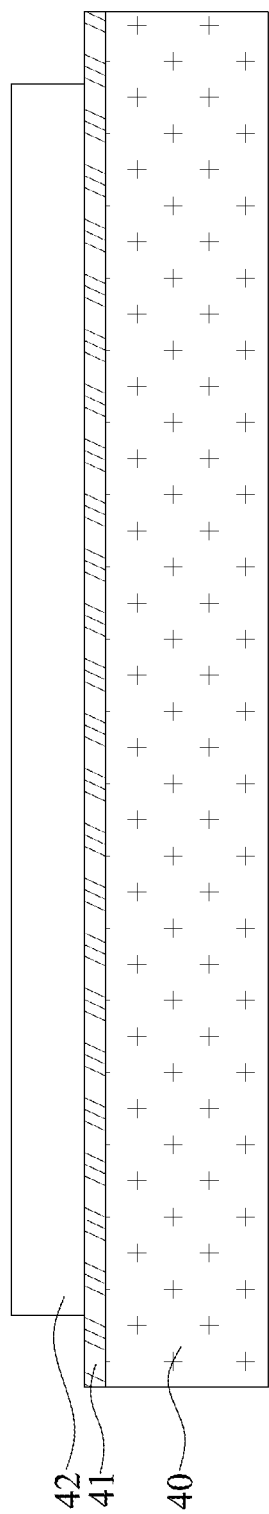

PACKAGE STRUCTURES AND METHODS OF MANUFACTURING THE SAME

BACKGROUND

1. Technical Field

The present disclosure generally relates to package structures and methods of manufacturing the same.

2. Description of the Related Art

To lower bonding temperature, nanowires have been used in Copper (Cu)-to-Cu bonding, which is regarded as an alternative bonding method to achieving fine-pitch integration and to replace solder bonding.

In an existing manufacturing process of nanowires being used in Cu-to-Cu bonding, an aluminum foil is directly formed on a surface having conductive pillars (for example, Cu pillars). An anodization operation is performed on the aluminum foil to fabricate an anodic aluminum oxide (AAO) template with porous or percolated structure. A patterned photoresist is used to block out regions on the AAO template not intended to form nanowires. Then, an electrodeposition operation is performed to fill the porous or percolated AAO, thus directly forming nanowires on the conductive pillars. Afterwards, the photoresist and the AAO template are removed from the surface having the conductive pillars.

However, problems of such manufacturing process include, for example, that thick aluminum foil (e.g., greater than 10 μm) is used in respect to serving as an AAO template, where thick aluminum foil is prone to delaminate from the underlying substrate. Also, strong acid (e.g., pH<3) is exploited to carry out the anodization procedure, and such chemical may limit the workability of other components such as the underlying structure. In addition, the patterned photoresist used to form small and dense openings may further reduce the diameter and the pitch of the conductive pillars. Furthermore, a strong acid (e.g., pH<3) is again used to remove the AAO template after metal (e.g., Cu) electrodeposition, which may reduce the structural integrity of the just-formed nanowires.

SUMMARY

In some arrangements, a package structure includes a substrate including a conductive element and a plurality of wires having a surface area through which heat of the conductive element can be dissipated, lowering a bonding temperature of the conductive element. The package structure also includes a conductive layer disposed between the conductive element of the substrate and the plurality of wires. The conductive contact layer attaches the plurality of wires over the conductive element.

In some arrangements, a package structure includes a first conductive element and a first low temperature bonding structure disposed over the first conductive element and connecting the first conductive element with a second conductive element. The package structure also includes a first conductive inter layer bonding the first conductive element to the first low temperature bonding structure and spaced apart from the second conductive element. The first low temperature bonding structure has a non-entangled portion in contact with the first conductive inter layer and an entangled portion outside of the first conductive inter layer.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 1H illustrates an enlarged view of a nanowire bonding structure in accordance with some arrangements of the present disclosure.

FIG. 1I illustrates an enlarged view of a nanowire bonding structure in accordance with some arrangements of the present disclosure.

FIG. 4A to FIG. 4H illustrate various intermediate stages of a method for manufacturing a nanowire bonding structure in a cross sectional perspective, in accordance with some arrangements of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
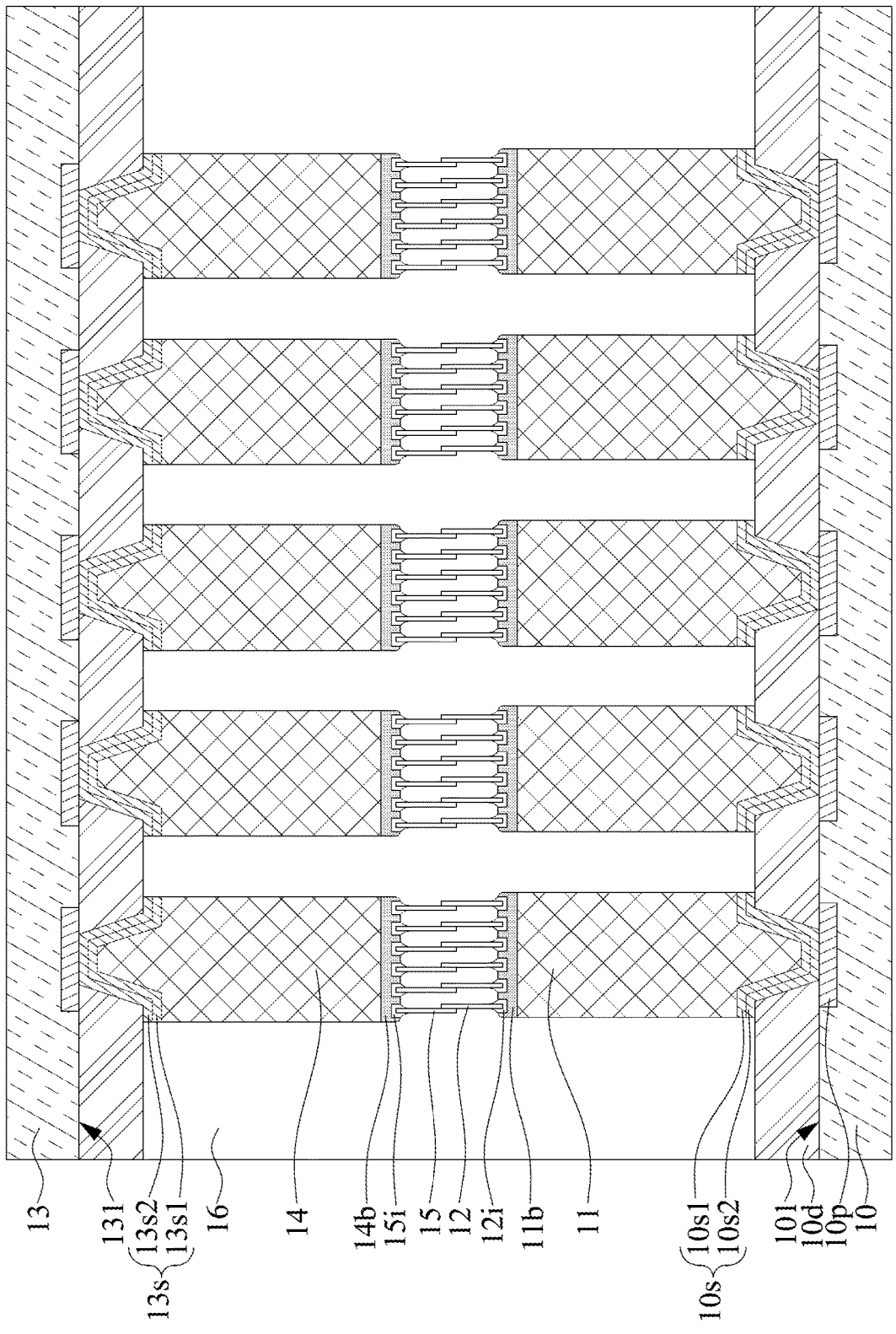
FIG. 1A illustrates a cross sectional view of a nanowire bonding structure in accordance with some arrangements of the present disclosure.

The following disclosure provides for many different arrangements, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include arrangements in which the first and second features are formed in direct contact, and may also include arrangements in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various arrangements and/or configurations discussed.

Arrangements of the present disclosure are discussed in detail below. It should be appreciated, however, that the present disclosure provides many applicable concepts that can be embodied in a wide variety of specific contexts. The specific arrangements discussed are merely illustrative and do not limit the scope of the disclosure.

The present disclosure provides nanowire bonding structures and methods of manufacturing the same. The nanowires are formed on a temporary carrier and then transferred to a bonding layer over a top surface of a conductive pillar. In addition, during a reflow operation, the bonding layer may soften, become flowable, or climb/flow onto the lateral surfaces of nanowires. Intermetallic compound (IMC) may formed between the nanowires and the bonding layer to improve the bonding strength. The conventional nanowire bonding structures include dense regions (more nanowires) and sparse regions (fewer nanowires) that are defined and hence, a clustering structure of the nanowires can be obtained, rendering voids at the completion of metal-metal bonding. Nanowires prepared as disclosed herein provide a substantially uniform distribution or arrangement of the nanowires. Therefore, less or no voids is formed after metal-metal (e.g., Cu-to-Cu) bonding, and the reliability of the electrical connection can be improved. In addition, implementing nanowire mass transfer operation of the present disclosure can achieve a small pillar or pad pitch (e.g., less than 30 nm) and low temperature (e.g., less than 150° C.) metal-metal bonding.

FIG. 1A illustrates a cross sectional view of a nanowire bonding structure 1 in accordance with some arrangements of the present disclosure. The nanowire bonding structure 1 includes substrates 10, 13, conductive elements 11, 14, nanowires 12, 15 and an underfill 16.

In some arrangements, the substrate 10 may include, for example, a printed circuit board (PCB), such as a paper-based copper foil laminate, a composite copper foil laminate, or a polymer-impregnated glass-fiber-based copper foil laminate. In some arrangements, the substrate 10 may include a unit substrate or a strip substrate. A unit substrate may include, for example, a unit chip (e.g., a communication chip, a microprocessor chip, a graphics chip, or a micro-electromechanical systems (MEMS) chip diced from a wafer), a unit package, a unit interposer, or a combination thereof. A strip substrate may include, for example, a plurality of unit substrates. In some arrangements, the substrate 10 may include an interconnection structure, such as a redistribution layer (RDL) and/or a grounding element.

The substrate 10 may include a surface 101 facing the substrate 13. The surface 101 may include an active surface. As used herein, the term "active side" or "active surface" of a component may refer to a side or a surface of an electronic component on which electrical or contact terminals such as contact pads, conductive studs or conductive pillars are disposed, for transmission of electrical signals or power. The "inactive side" or "inactive surface" of a component may refer to a surface of the electronic component on which no contact terminals are disposed. The substrate 10 may include one or more conductive pads 10p in proximity to, adjacent to, directly on, or embedded in and exposed by the surface 101 of the substrate 10. A dielectric layer 10d may be disposed directly on the surface 101 of the substrate 10 and cover a part but not all of each of the conductive pads 10p. Another part of each of the conductive pads 10p may be exposed by the dielectric layer 10d. For example, the dielectric layer 10d may include one or more openings exposing the another part of each of the conductive pads 10p.

The dielectric layer 10d may include, for example, organic material(s) (such as, a solder mask, a polyimide (PI), an epoxy, an Ajinomoto build-up film (ABF), a polypropylene (PP), and a bismaleimide triazine (BT)), inorganic material(s) (such as a silicon oxide (SiOx), a silicon nitride (SiNx), a tantalum oxide (TaOx), silicon, a glass, a ceramic, and quartz), or a combination of two or more thereof.

A seed layer 10s may be disposed over the surface 101 of the substrate 10. The seed layer 10s may be disposed over a portion of the dielectric layer 10d and extend into the openings of the dielectric layer 10d that expose the conductive pads 10p. The seed layer 10s may be in direct contact with a surface of the dielectric layer 10d facing away from the substrate 10. The seed layer 10s may be in direct contact with the conductive pads 10p. In some arrangements, the seed layer 10s may include sublayers 10s1 and 10s2. In some arrangements, the seed layer 10s may include, for example, titanium (Ti), copper (Cu), nickel (Ni), another metal, an alloy (such as a titanium-tungsten alloy (TiW)), or a combination thereof. The seed layer 10s may include sublayers 10s1 and 10s2. In some arrangements, the sublayer 10s1 may include Cu and the sublayer 10s2 may include Ti.

One or more conductive elements 11 may be disposed over the surface 101 of the substrate 10. The conductive elements 11 may be disposed over and directly contacting the seed layer 10s. Each of the conductive elements 11 may be electrically connected with a respective seed layer 10s. The conductive elements 11 may be electrically connected with the interconnection structure (not shown for clarity) in the substrate 10. In some arrangements, the conductive elements 11 may be formed through electroplating with the seed layer 10s.

Figure 2A:
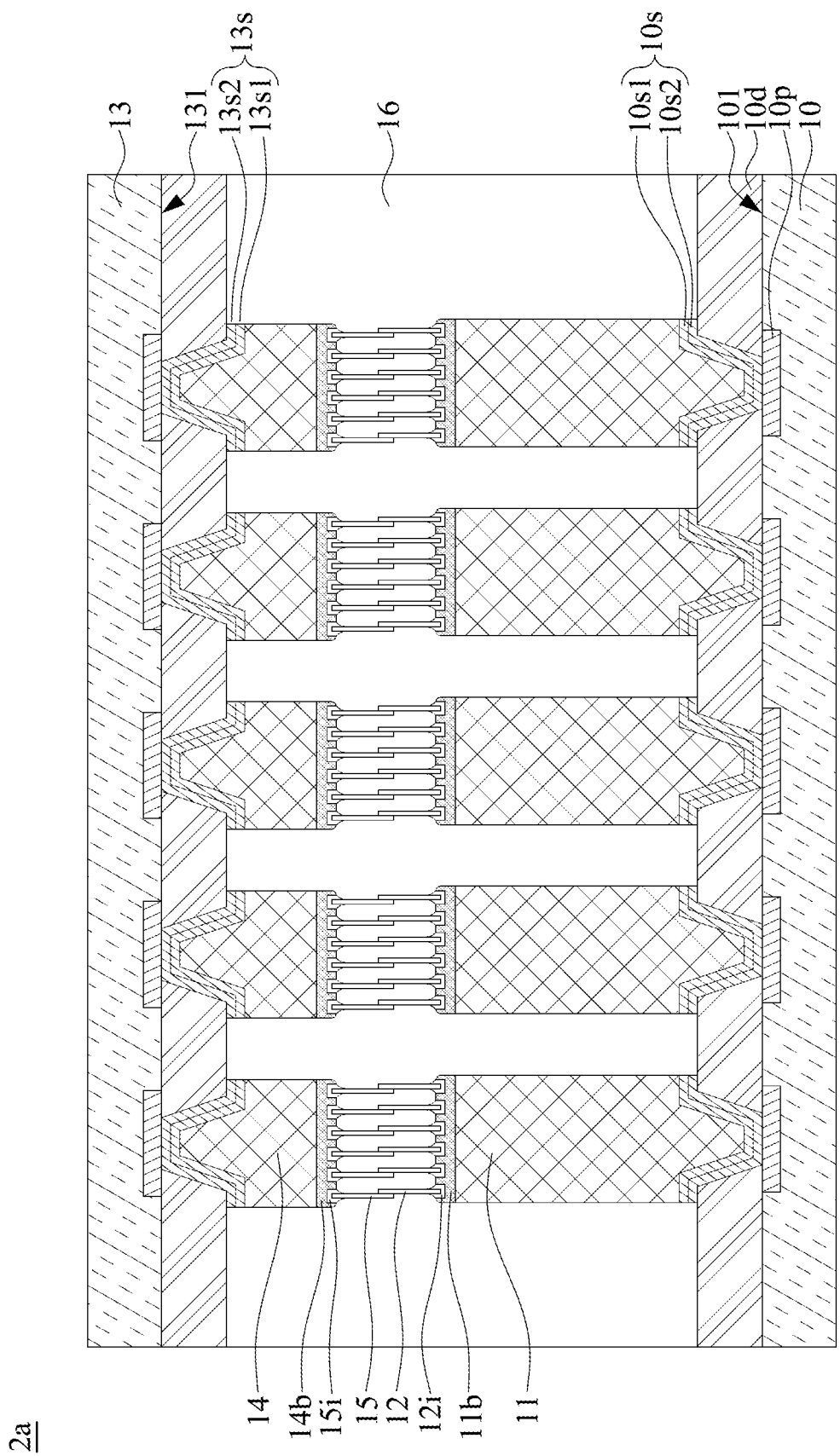
FIG. 2A illustrates a cross sectional view of a nanowire bonding structure in accordance with some arrangements of the present disclosure.
Figure 2B:
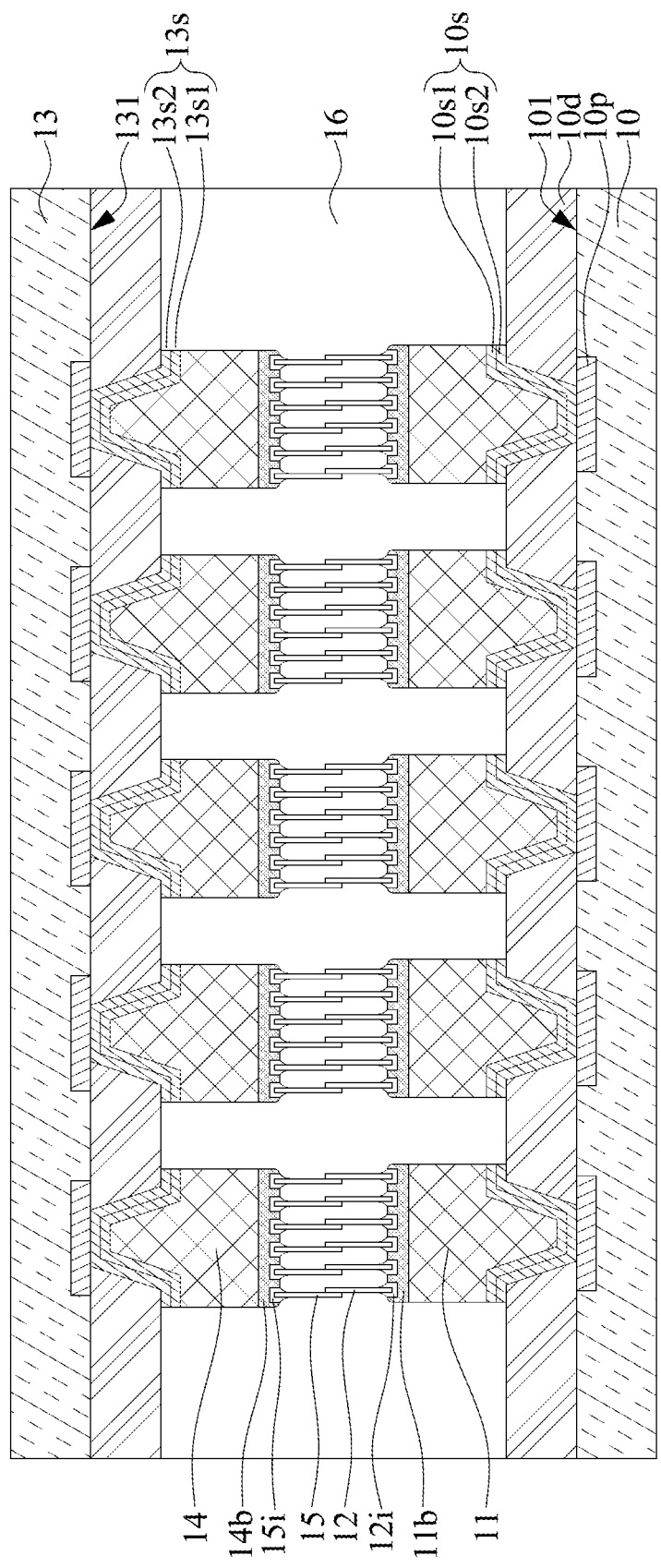
FIG. 2B illustrates a cross sectional view of a nanowire bonding structure in accordance with some arrangements of the present disclosure.

The conductive elements 11 may include a conductive via, a conductive pillar (as shown in FIG. 1A), a conductive pad (as shown in FIG. 2B), or a combination thereof. In some arrangements, the conductive elements 11 may include a conductive material, such as Cu, gold (Au), tin (Sn), silver (Ag), aluminum (Al), tungsten (W), nickel (Ni), or other suitable materials.

The conductive elements 11 may extend along a direction substantially perpendicular to the surface 101 of the substrate 10. The conductive elements 11 may have a length or height of 6 μm in some examples. The conductive elements 11 may have a width or diameter of from 6 μm to 10 μm in some examples. The pitch of the conductive elements 11 (e.g., the distance between two adjacent conductive elements 11) may be less than 30 μm, such as 20 μm, 10 μm, 9 μm, etc., in some examples. In other arrangements, the length, width, and pitch of the conductive elements 11 can be adjusted depending on different applications (e.g., the different input/output (I/O) pads of the substrates 10 and 11). For example, the length of the conductive elements 11 can be less than 6 μm or greater than 6 μm.

Each top surface of the conductive elements 11 may be provided with a bonding layer 11b. The bonding layers 11b may be disposed over and/or directly contacting the top surfaces of the conductive elements 11. The bonding layers 11b may cover or encapsulate the top surfaces of the conductive elements 11. In some arrangements, the bonding layer 11b may cover or encapsulate a part of the lateral surfaces of the conductive element 11, as shown in FIG. 1G. For example, a lateral surface of the bonding layer 11b protrudes from a lateral surface of the conductive element 11. In some arrangements, the bonding layer 11b may cover or encapsulate the entire lateral surface of the conductive element 11. The bonding layers 11b may be disposed between the conductive elements 11 and the nanowires 12. The nanowires 12 can be referred to as a low temperature bonding structure in this disclosure. The bonding layers 11b may surround ends of the nanowires 12 adjacent to the conductive elements 11. The bonding layers 11b may at least partially surround lateral surfaces of the nanowires 12, adjacent to the ends of the nanowires 12 that are adjacent to the conductive elements 11. The bonding layers 11b may space adjacent nanowires 12 apart from each other, such that a portion of the bonding layers 11b is between two adjacent nanowires 12. In some arrangements, the bonding layers 11b may be electroplated over top surfaces of the conductive elements 11 with the seed layers (not shown in the figures). The electroplating operation for the bonding layers 11b is performed after the electroplating operation for the conductive elements 11.

In some arrangements, the bonding layers 11b can be one or more conductive layers, or can be referred to as an inter layer, an attaching layer, a binding layer, or a transfer-assisting layer throughout this disclosure. In some arrangements, the bonding layers 11b may be configured to bond, adhere, or secure the nanowires 12 over or on the top surfaces of the conductive elements 11. In some arrangements, the bonding layers 11b may be configured to provide sufficient bonding strength for the nanowires 12 so that the nanowires 12 can be successfully transferred from a temporary carrier to the top surfaces of the conductive elements 11 in a mass transfer operation. In other words, the nanowires 12 may be formed on a temporary carrier, and subsequently transferred to the top surfaces of the conductive elements 11 through the attachment or bonding established between the nanowires 12 and the bonding layers 11b.

In some arrangements, the bonding layers 11b may include a reflowable material, such as a room-temperature (e.g., 25 to 35 degrees Celsius) reflowable material. In some arrangements, the bonding layers 11b may include a soldering material. In some arrangements, the bonding layers 11b may include semiconductive material, such as gallium (Ga), indium (In), tin (Sn), bismuth (Bi), or other suitable materials. In some arrangements, the bonding layers 11b and the conductive elements 11 may include the same material. In some arrangements, the bonding layers 11b may have a material different from the conductive elements 11. In some arrangements, the bonding layers 11b may have a thickness of 2 μm or less. In some arrangements, the bonding layers 11b may also be referred to as a conductive adhesive layer or a conductive contact layer.

Each top surface of the conductive elements 11 may be provided with a nanowire cluster or nanowire array. For example, the nanowires 12 may be disposed over the top surfaces of the conductive elements 11. In some arrangements, the nanowires 12 may include a conductive material, such as copper (Cu), gold (Au), tin (Sn), silver (Ag), aluminum (Al), tungsten (W), nickel (Ni), or other suitable materials. In some arrangements, the nanowires 12 and the conductive elements 11 may include the same material. In some arrangements, the nanowires 12 may have a material different from the conductive elements 11.

In some arrangements, each nanowire 12 may have the shape of a rod or a cylinder. The nanowires 12 may be solid or hollow. A portion of the nanowires 12 may extend along a direction substantially perpendicular to the surface 101 of the substrate 10 and/or parallel to the direction in which the conductive elements 11 extend. The nanowires 12 may have a length or height of from 1 μm to 10 μm in some examples. The nanowires 12 may have a width or diameter of from 50 nm to 100 nm in some examples. In some arrangements, the counts of the nanowires 12 on one of the conductive elements 11 (with a diameter of 10 μm) may be more than 18,000, more than 40,000, or even more. In other arrangements, the length, width, and counts of the nanowires 12 can be adjusted depending on different applications or different manufacturing conditions or settings (e.g., different temperatures, voltages, and time durations in the operation in FIG. 4B). In some arrangements, the nanowires 12 may have different shapes, lengths, rigidity, and orientations as shown in FIGS. 1D, 1E, and 1F.

In FIG. 1A, the base portions of the nanowires 12 may be substantially oriented or aligned in the same direction, for example, extending in the general direction of the substrate 13. The spacing or pitch among the base portions of the nanowires 12 (e.g., the distance between two adjacent base portions of the nanowires 12) may be substantially constant or identical. For example, the base portions of the nanowires 12 may be substantially parallel to each other.

In some arrangements, intermetallic compound (IMC) layers 12i may be formed between the nanowires 12 and the bonding layers 11b, or at the interface of the nanowires 12 and the bonding layers 11b where an end of the respective nanowires 12 is embedded in the bonding layer 11b. In some arrangements, the IMC layers 12i may cover or encapsulate ends of the nanowires 12. In some arrangements, the IMC layers 12i may at least partially cover or encapsulate lateral surfaces of the nanowires 12. In some arrangements, the IMC layers 12i may be spaced apart from the top surface of the conductive elements 11 by a portion of the bonding layer 11b. In this case, the nanowires 12 as well as the associated respective IMC layers 12i appear to "float" over the conductive elements 11 in the body of the bonding layer 11b. In some arrangements, the IMC layer 12i may contact the top surface of the conductive element 11 under certain condition, for example, when the respective end of the nanowire 12, right after mass transfer operation, being very close to said top surface of the conductive element 11, causing the IMC layer 12i to occupy the space between the respective end of the nanowire 12 and said top surface of the conductive element 11.

In some arrangements, the IMC layers 12i may include copper gallium compounds or copper tin compounds. In some arrangements, the IMC layers 12*i* may be configured to provide sufficient bonding strength for the nanowires 12 so that the nanowires 12 can be successfully transferred from a temporary carrier to the top surfaces of the conductive elements 11 in a mass transfer operation.

In some arrangements, the melting point of the bonding layers 11*b* may be lower than the melting point of the IMC layers 12*i*. In some arrangements, the melting point of the bonding layers 11*b* may be lower than the melting point of the nanowires 12. In some arrangements, the melting point of the bonding layers 11*b* may be lower than the melting point of the conductive elements 11. The differences of melting points of the elements 11, 11*b*, 12, and 12*i* allow the elements to be bonded formed onto one another due to temperature differentials, as described herein.

The substrate 10 may be electrically connected with the substrate 13 using the conductive elements 11 and 14 and the nanowires 12 and 15. In some arrangements, the nanowires 12 and 15 are configured to lower the bonding temperature of the conductive elements 11 and 14. For example, Cu—Cu direct bonding temperature (i.e., only conductive elements 11 and 14 and without nanowires) is carried out at a temperature close to the melting point of Cu (e.g., 500° C. to 600° C.). Cu—Cu hybrid bonding temperature (i.e., only conductive elements 11 and 14, planarized dielectric layer, and without nanowires) is carried out in a temperature range of from about 210° C. to about 250° C. With the nanowires 12 and 15 disposed on the conductive elements 11 and 14, the Cu—Cu bonding temperature (i.e., conductive elements 11 and 14 with nanowires) can be lowered to about 200° C. In some arrangements, the Cu—Cu bonding temperature (i.e., conductive elements 11 and 14 with nanowires) can even be lowered to about 150° C. with the assistance of gallium. In some arrangements, the bonding temperature utilized to bond the opposite clusters of nanowires 12, 15 may be lower than Cu—Cu direct bonding temperature, and is also lower than the melting point of the IMC layer 12*i* (e.g., about 254° C.). The substrate 13, the conductive elements 14, and the nanowires 15 may respectively be similar to the substrate 10, the conductive elements 11, and the nanowires 12. Some detailed descriptions may refer to the corresponding disclosure herein concerning the substrate 10, conductive elements 11, and nanowires 12, and are not repeated hereinafter for conciseness.

The substrate 13 may be disposed over the substrate 10. The substrate 13 may be referred to as an upper substrate and the substrate 10 may be referred to as a lower substrate. The substrate 13 may include a surface 131 facing the substrate 10. The surface 131 may include an active surface. The substrate 13 may include one or more conductive pads (similar to 10*p*) in proximity to, adjacent to, directly on, or embedded in and exposed by the surface 131 of the substrate 13. A dielectric layer such as the dielectric layer 10*d* may be disposed directly on the surface 131 of the substrate 13 and cover a part but not all of each of the conductive pads of the substrate 13. Another part of each of the conductive pads may be exposed by the dielectric layer. For example, the dielectric layer may include one or more openings exposing the another part of each of the conductive pads. A seed layer 13*s* (including sublayers 13*s*1 and 13*s*2) similar to the seed layer 10*s* may be disposed over the surface 131 of the substrate 13.

One or more conductive elements 14 may be disposed over the surface 131 of the substrate 13. The conductive elements 14 may be disposed over and directly contacting the seed layer 13*s*. Each of the conductive elements 14 may be electrically connected with a respective the seed layer 13*s*. The conductive elements 14 may be electrically connected with the interconnection structure (not shown for clarity) in the substrate 13.

The conductive elements 14 may include a conductive via, a conductive pillar (as shown in FIG. 1A), a conductive pad (as shown in FIGS. 2A and 2B), or a combination thereof.

Each top surface of the conductive elements 14 may be provided with a bonding layer 14*b*. The bonding layers 14*b* may be disposed over and/or directly contacting the top surfaces of the conductive elements 14. The bonding layer 14*b* may cover or encapsulate the top surfaces of the conductive element 14. The bonding layer 14*b* may be disposed between the conductive element 14 and the nanowires 15. The bonding layers 14*b* may surround ends of the nanowires 15 adjacent to the conductive elements 14. The bonding layers 14*b* may at least partially surround lateral surfaces of the nanowires 15, adjacent to the ends of the nanowires 15 that are adjacent to the conductive elements 14. The bonding layers 14*b* may space adjacent nanowires 15 apart from each other.

In some arrangements, the bonding layers 14*b* may be configured to bond, adhere, or secure the nanowires 15 to be approximate to the bottom surfaces of the conductive elements 14. In some arrangements, the bonding layers 14*b* may be configured to provide sufficient bonding strength for the nanowires 15 so that the nanowires 15 can be successfully transferred from a temporary carrier to the top surfaces of the conductive elements 14 in a mass transfer operation.

Each top surface of the conductive elements 14 may be provided with a nanowire cluster or nanowire array. For example, the nanowires 15 may be disposed over the top surfaces of the conductive elements 14. The nanowires 15 may contact the nanowires 12. For example, the nanowires 15 may directly contact the nanowires 12.

In some arrangements, IMC layers 15*i* may be formed between the nanowires 15 and the bonding layers 14*b* or at the interface of the nanowires 15 and the bonding layers 14*b* where an end of the respective nanowires 15 is embedded in the bonding layer 14*b*. In some arrangements, the IMC layers 15*i* may cover or encapsulate ends of the nanowires 15. In some arrangements, the IMC layers 15*i* may at least partially cover or encapsulate lateral surfaces of the nanowires 15. In some arrangements, the IMC layers 15*i* may be spaced apart from the top surface of the conductive elements 14 by a portion of the bonding layer 14*b*. In this case, the nanowires 15 as well as the associated respective IMC layers 15*i* appear to "float" over the conductive elements 14 in the body of the bonding layer 14*b*. In some arrangements, the IMC layer 15*i* may contact the top surface of the conductive element 14 under certain condition, for example, when the respective end of the nanowire 15, right after mass transfer operation, being very close to said top surface of the conductive element 11, causing the IMC layer 15*i* to occupy the space between the respective end of the nanowire 15 and said top surface of the conductive element 14.

The underfill 16 may be disposed between the substrate 10 and the substrate 13. The underfill 16 may surround, cover, or encapsulate at least a portion of the conductive elements 11 and 14 and the nanowires 12 and 15. In some arrangements, the underfill 16 may supply additional bonding strength between the substrate 10 and the substrate 13. In some arrangements, the underfill 16 may provide environmental protection from moisture, particles, and other contamination to the conductive elements 11 and 14 and the nanowires 12 and 15. In some arrangements, the underfill 16 may include, for example, an epoxy, polyimide, polyurethane, etc.

In some arrangements, nanowires are directly formed on the conductive pillars and directly contact the conductive pillars through an electroplating operation. Given that the electroplating operation involve direct deposition from the top surface of the conductive pillars, respective end of the nanowires formed in such arrangement does not appear to "float" over but to "stand" on the conductive pillar. In such arrangements, no bonding layer and hence no IMC is present between the nanowires and the conductive pillars.

According to some arrangements of the present arrangements, by using the bonding layers 11*b* and 14*b* to bond, adhere, or secure the nanowires 12 and 15, IMC may formed therebetween. Therefore, the bonding strength and the structural stability of the nanowires 12 and 15 can be improved.

Figure 1B:
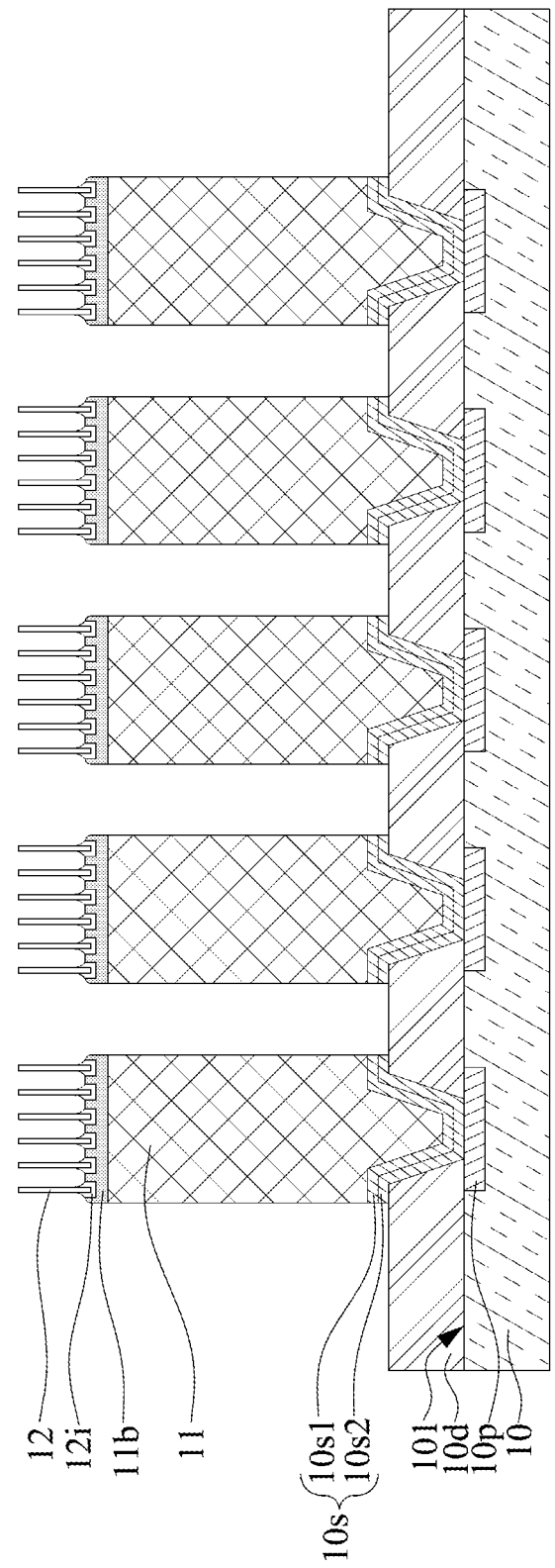
FIG. 1B illustrates a cross sectional view of a part of a nanowire bonding structure in accordance with some arrangements of the present disclosure.

FIG. 1B illustrate a cross sectional view of a nanowire bonding structure in accordance with some arrangements of the present disclosure. The nanowire bonding structure in FIG. 1B is similar to the nanowire bonding structure 1 in FIG. 1A except that the substrate 13, the conductive elements 14, the nanowires 15 and the underfill 16 are omitted. The nanowire bonding structure of FIG. 1B can include a single substrate or a single electronic device prior to the metal-metal bonding described herein.

Figure 1C:
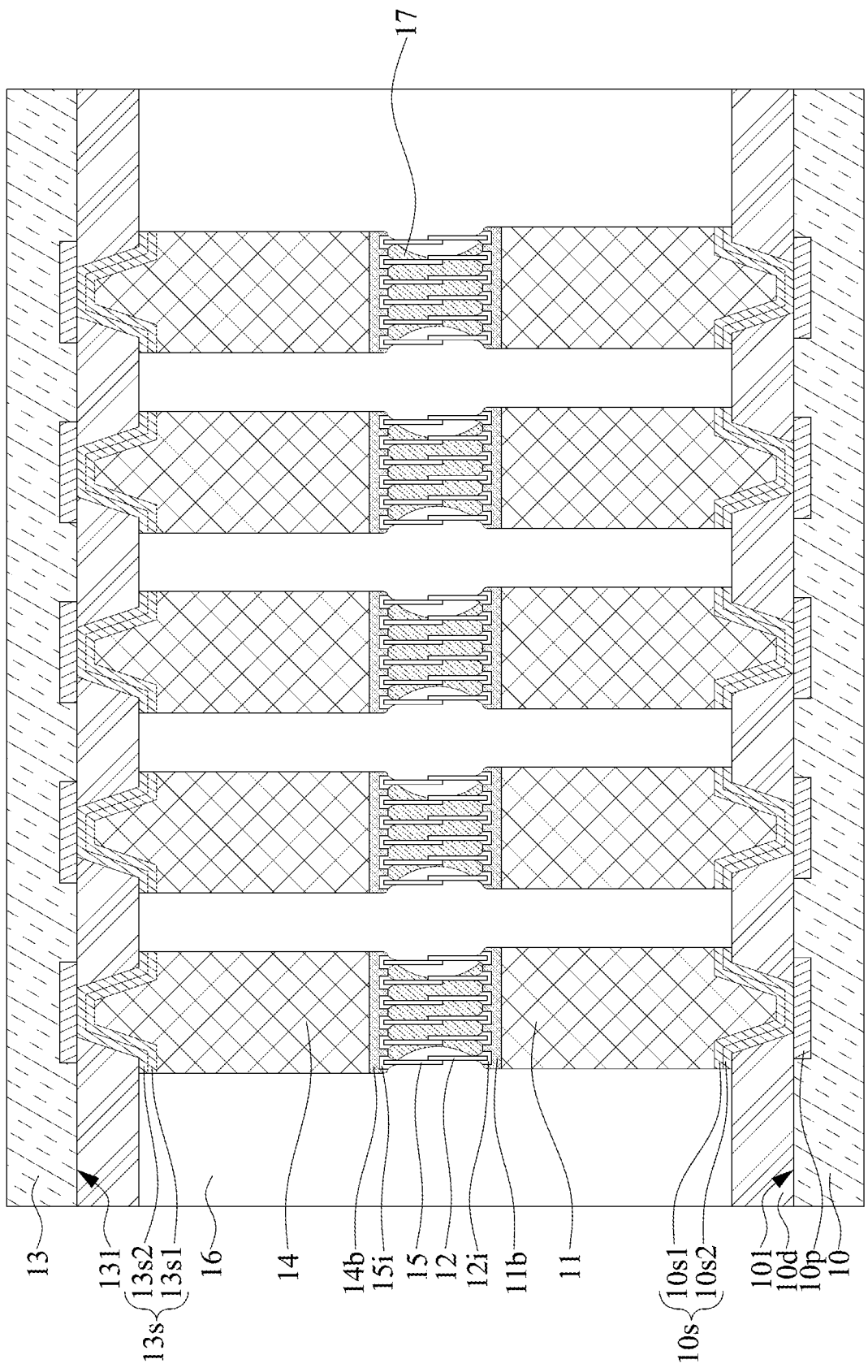
FIG. 1C illustrates a cross sectional view of a nanowire bonding structure in accordance with some arrangements of the present disclosure.
Figure 1E:
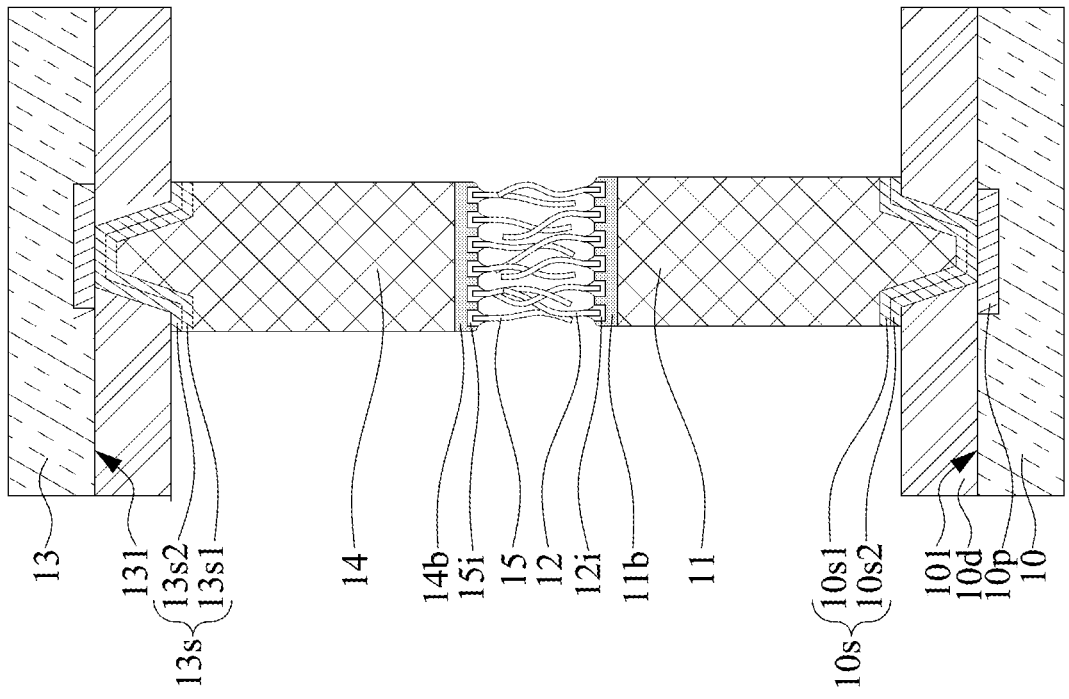
FIG. 1E illustrates a cross sectional view of a part of a nanowire bonding structure in accordance with some arrangements of the present disclosure.
Figure 1D:
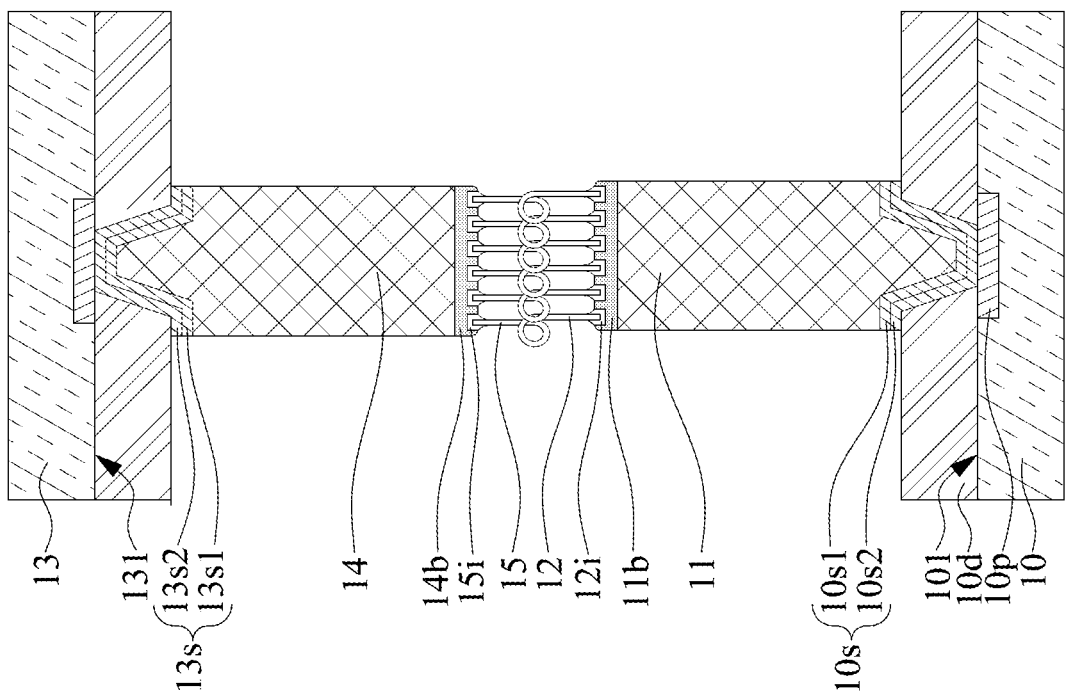
FIG. 1D illustrates a cross sectional view of a part of a nanowire bonding structure in accordance with some arrangements of the present disclosure.
Figure 1G:
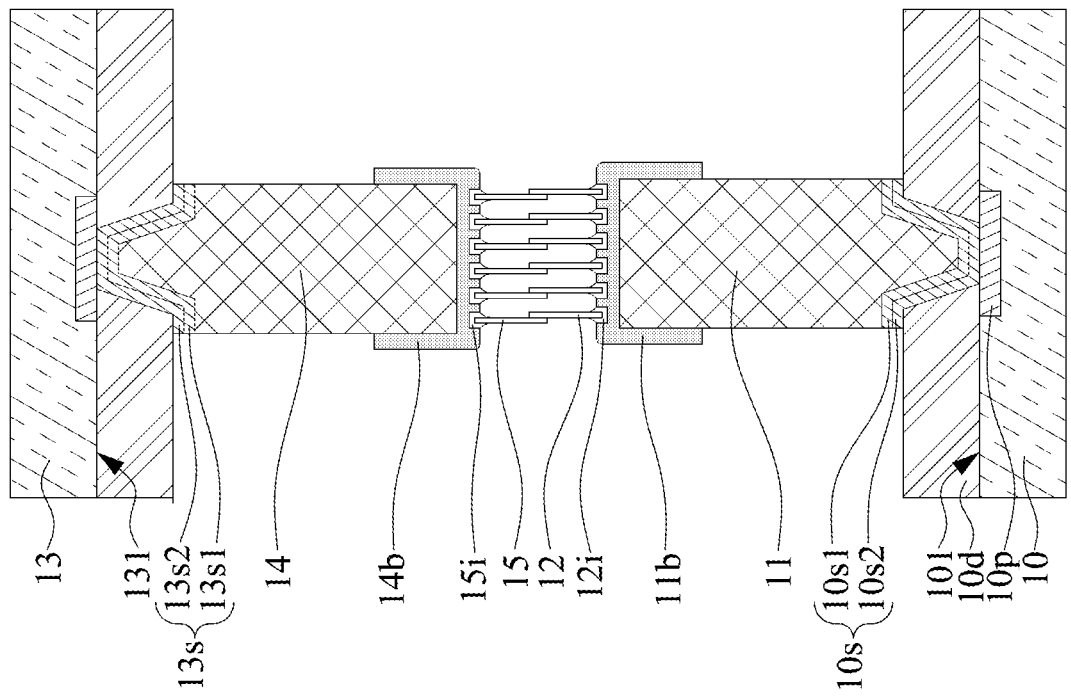
FIG. 1G illustrates a cross sectional view of a part of a nanowire bonding structure in accordance with some arrangements of the present disclosure.
Figure 1F:
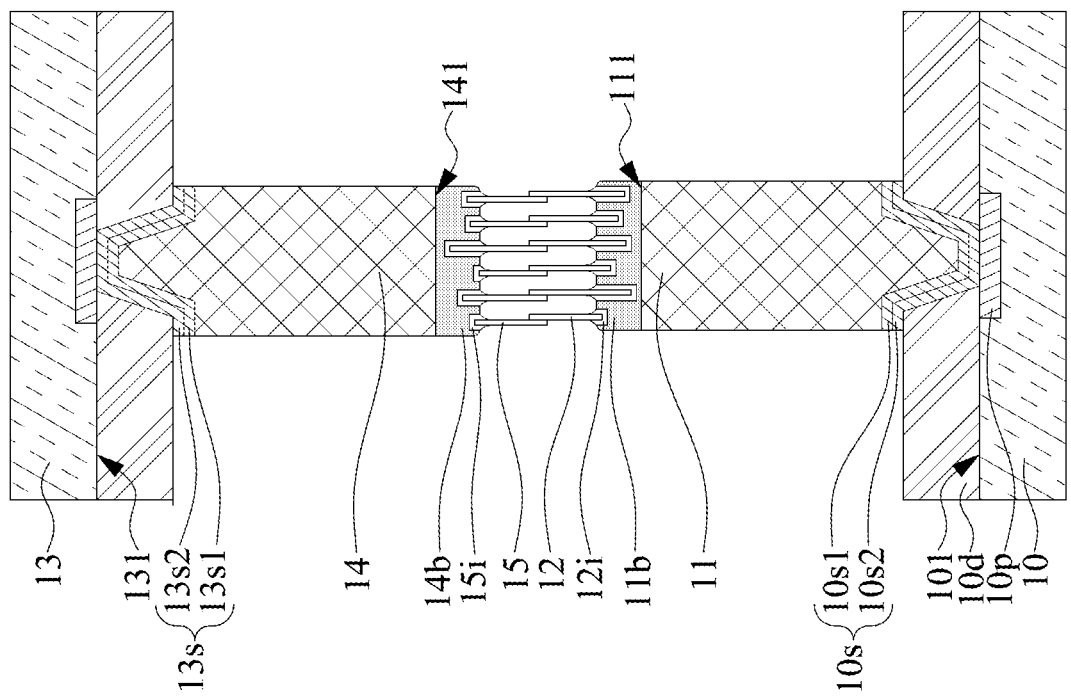
FIG. 1F illustrates a cross sectional view of a part of a nanowire bonding structure in accordance with some arrangements of the present disclosure.
Figure 11:
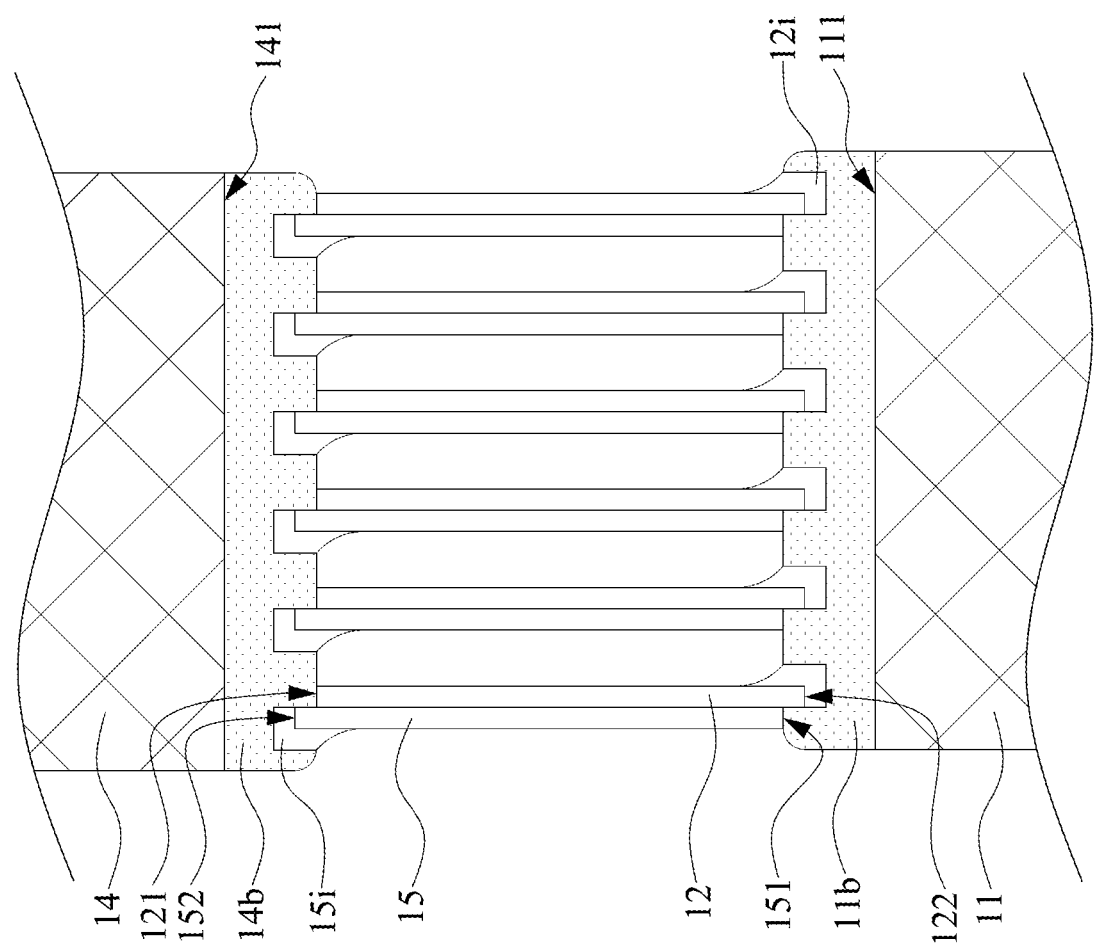

FIG. 1C illustrate a cross sectional view of a nanowire bonding structure in accordance with some arrangements of the present disclosure. The nanowire bonding structure in FIG. 1C is similar to the nanowire bonding structure 1 in FIG. 1A except for the differences described below.

In some arrangements, when the reflowable temperature of the bonding layers 11*b* and/or 14*b* is reached, the bonding layers 11*b* and/or 14*b* can be soften, liquefied, or become flowable and may be climb/flow into the nanowires 12 and 15 (e.g., into the spaces between the bonding layers 11*b* and/or 14*b*) when additional bonding layer material is applied. In some arrangements, the bonding layer 11*b* may be connected with the bonding layer 14*b*, forming a bonding structure 17. In some arrangements, the bonding structure 17 may have a curved lateral surface from a cross sectional view due to surface tension demonstrated by the reflowable material of the bonding layers 11*b* and/or 14*b* at the reflowable temperature.

In some arrangements, an additional bonding layer material may be applied after the mass transfer of the nanowire clusters from the temporary carrier and prior to the metal-metal bonding operation. For example, the bonding structure 17 may be formed by dispensing liquid gallium on at least one of the bonding layers 11*b* and 14*b*, respectively. In some arrangements, the bonding structure 17 having excessive bonding layer material may help reduce or prevent the voids at the completion of metal-metal bonding.

In some arrangements, the bonding structure 17 may include a reflowable material. In some arrangements, the bonding structure 17 may include a conductive material, such as gallium (Ga), indium (In), tin (Sn), bismuth (Bi), or other suitable materials. In some arrangements, the bonding structure 17 may include an IMC. For example, a portion of the bonding structure 17 contacting the nanowires 12 and 15 may form an IMC with the nanowires 12 and 15. In some arrangements, a portion of the bonding structure 17 may remain as gallium or other reflowable material.

FIG. 1D illustrate a cross sectional view of a part of a nanowire bonding structure in accordance with some arrangements of the present disclosure. The nanowire bonding structure in FIG. 1D is similar to the nanowire bonding structure 1 in FIG. 1A except for the differences described below. For conciseness, only one conductive element 11 and one conductive element 14 are illustrated in FIG. 1D and the underfill 16 is not shown in FIG. 1D.

The nanowires 12 include base portions (or non-entangled portions) embedded, penetrating, or piercing the bonding layer 11*b* and free end portions (or entangled portions) opposite to the base portions. The base portions of the nanowires 12 may be covered by the IMC layers 12*i*. The free end portions of the nanowires 12 may be covered by the underfill 16 shown in FIG. 1A.

The base portions of the nanowires 12 may be substantially straight and possess discrete locations that can be identified or defined with the associated IMC layers or regions. In other words, the base portions of the nanowires 12 are positioned at known locations, for example, relative to the bonding layers 11*b* and/or the top surface of the conductive element 11. The free end portions of the nanowires 12 may be tangled and/or intertwined with adjacent free end portions of the nanowires 12. For example, the nanowires 12 may each include a non-entangled portion in contact with the bonding layer 11*b* and an entangled portion outside of the bonding layer 11*b*.

The nanowires 15 include base portions embedded, penetrating, or piercing the bonding layer 14*b* and free end portions opposite to the base portions. The base portions of the nanowires 15 may be covered by the IMC layers 15*i*. The free end portions of the nanowires 15 may be covered by the underfill 16 shown in FIG. 1A.

The base portions of the nanowires 15 may be substantially straight and possess discrete locations that can be identified or defined with the associated IMC layers or regions. In other words, the base portions of the nanowires 15 are positioned at known locations, for example, relative to the bonding layers 14*b* and/or the bottom surface of the conductive element 14. The free end portions of the nanowires 15 may be tangled and/or intertwined with adjacent free end portions of the nanowires 15. For example, the nanowires 15 may each include a non-entangled portion in contact with the bonding layer 14*b* and an entangled portion outside of the bonding layer 14*b*.

The free end portions of the nanowires 12 may be tangled and/or intertwined with the free end portions of the nanowires 15 in some examples. One or more of the nanowires 12 may be twisted with one or more of the nanowires 15 in some examples. One or more of the nanowires 12 and one or more of the nanowires 15 may be interlocked in some examples.

FIG. 1E illustrate a cross sectional view of a part of a nanowire bonding structure in accordance with some arrangements of the present disclosure. The nanowire bonding structure in FIG. 1E is similar to the nanowire bonding structure in FIG. 1A except for the differences described below. For conciseness, only one of the conductive elements 11 and one of the conductive elements 14 are illustrated in FIG. 1E and the underfill 16 is omitted.

In FIG. 1E, the base portions of the nanowires 12 may be randomly positioned. The extension orientations of the base portions of each of the nanowires 12 may be different. The spacing or pitch among the base portions of the nanowires 12 may be different. That is, the spacing or pitch among the base portions of the nanowires 12 (e.g., the distance between two adjacent base portions of the nanowires 12) may be random. Other forms of nanowire cluster or nanowire arrays with randomized arrangements in terms of location of the base portion and the direction of extension can be likewise implemented. Since nanowires in the nanowire cluster or nanowire array can be formed with a high aspect ratio (e.g., high ratio of length to width), the nanowires can be tangled easily once released from the scaffold (e.g., AAO) on the temporary carrier. That is, prior to the mass transfer operation, the nanowire cluster or nanowire array can already be in a kinked form.

FIG. 1F illustrate a cross sectional view of a part of a nanowire bonding structure in accordance with some arrangements of the present disclosure. The nanowire bonding structure in FIG. 1F is similar to the nanowire bonding structure in FIG. 1A except for the differences described below. For conciseness, only one of the conductive elements 11 and one of the conductive elements 14 are illustrated in FIG. 1F and the underfill 16 is not shown in FIG. 1F.

The base portions of the nanowires 12 may have different distances with respect to a surface 111 of the conductive element 11. That is, the base portions of the nanowires 12 and the IMC layer 12*i'* extend into the bonding layer 11*b* at different distances. The base portions of the nanowires 15 may have different distances with respect to a surface 141 of the conductive element 14. That is, the base portions of the nanowires 15 and the IMC layer 15*i'* extend into the bonding layer 14*b* at different distances. In addition, the nanowires 12 may have different lengths, and the nanowires 15 may have different lengths.

FIG. 1G illustrate a cross sectional view of a part of a nanowire bonding structure in accordance with some arrangements of the present disclosure. The nanowire bonding structure in FIG. 1G is similar to the nanowire bonding structure in FIG. 1A except for the differences described below. For conciseness, only one of the conductive elements 11 and one of the conductive elements 14 are illustrated in FIG. 1G and the underfill 16 is not shown in FIG. 1G.

The bonding layers 11*b* may cover or encapsulate a part of the lateral surfaces of the conductive elements 11. In some other arrangements, the bonding layers 11*b* may surround a part of the lateral surfaces of the conductive elements 11. In some arrangements, the bonding layer 11*b* may cover or encapsulate the entire lateral surface of the conductive element 11.

FIG. 1H illustrates an enlarged view of a nanowire bonding structure in accordance with some arrangements of the present disclosure. In some arrangements, the nanowire bonding structure in one or more figures herein may have an enlarged view as shown in FIG. 1H.

The conductive element 11 may include a surface 111 (which may also be referred to as a top surface of the conductive element 11) facing the conductive element 14. An IMC layer 12*i'* may be formed between the surface 111 and the bonding layer 11*b*, or at the interface of the conductive element 11 and the bonding layer 11*b*. The conductive element 14 may include a surface 141 (which may also be referred to as a bottom surface of the conductive element 14) facing the conductive element 11. An IMC layer 15*i'* may be formed between the surface 141 and the bonding layer 14*b*, or at the interface of the conductive element 14 and the bonding layer 14*b*.

In some arrangements, the IMC layer 12*i'* may at least partially cover or encapsulate the surface 111. In some arrangements, the IMC layer 15*i'* may at least partially cover or encapsulate the surface 141. In some arrangements, the IMC layers 12*i'* and 15*i'* may include copper gallium compounds or copper tin compounds.

The nanowire 12 may be disposed between the conductive element 11 and the conductive element 14. The nanowire 12 may have an end 121 (or a free end portion) and an end 122 (or a base portion) opposite to the end 121. The end 122 may be proximal to the surface 111 of the conductive element 11. The end 122 may be closer to the surface 111 of the conductive element 11 than the end 121.

The end 122 of the nanowire 12 may be spaced apart from surface 111 of the conductive element 11 by the bonding layer 11*b*, the IMC layer 12*i'*, and the IMC layer 12*i*. The end 122 of the nanowire 12 may insert or embedded into the bonding layer 11*b* and the end 121 of the nanowire 12 may be exposed from the bonding layer 11*b*. At least a part of the end 122 of the nanowire 12 may be covered or encapsulated by the IMC layer 12*i* and further covered by the bonding layer 11*b*. For example, the IMC layer 12*i* may be directly disposed beneath the end 122 of the nanowire 12. For example, the IMC layer 12*i* and the bonding layer 11*b* may be disposed between the end 122 of the nanowire 12 and the surface 111 of the conductive element 11.

When a reflowable temperature of the bonding layer 11*b* is achieved, the bonding layer 11*b* may soften, become flowable, or climb/flow into a lateral surface 123 of the nanowire 12. The bonding layer 11*b* on the lateral surface 123 of the nanowire 12 may form the IMC 12*i* with the nanowire 12. The bonding layer 11*b* on the lateral surface of the nanowire 12 may form an IMC with the nanowire 12. Therefore, the lateral surface of the nanowire 12 may be partially surrounded or covered by the IMC layer 12*i* and partially exposed from the IMC layer 12*i*. In some arrangements, the lateral surface of the nanowire 12 exposed from the IMC layer 12*i* may be surrounded or covered by the underfill 16 shown in FIG. 1A. In some other arrangements, the lateral surface of the nanowire 12 may be entirely surrounded or covered by the IMC layer 12*i*.

In some arrangements, the IMC layer 12*i* may be partially surrounded or covered by the bonding layer 11*b* and partially exposed from the bonding layer 11*b*. In some arrangements, the IMC layer 12*i* exposed from the bonding layer 11*b* may be surrounded or covered by the underfill 16 shown in FIG. 1A. In some other arrangements, the IMC layer 12*i* may be entirely surrounded or covered by the bonding layer 11*b*.

In some arrangements, the IMC layer 12*i* may include a tapered portion at the lateral surface of the nanowire 12 as shown. In some arrangements, the tapered portion of the IMC layer 12*i* may taper from the end 122 toward the end 121 of the nanowire 12. The tapered portion of the IMC layer 12*i* is due to the surface tension of the bonding layer 11*b* at the reflowable temperature of the bonding layer 11*b*. During the mass transfer operation, the pre-formed nanowires are brought into contact with the bonding layer 11*b* under a temperature close to its reflowable point. When the bonding layer 11*b* becomes soften or flowable, the surface tension of the material of the bonding layer 11*b* is caused to upward-climb along the lateral surface of the pre-formed nanowires 12. When the intermetallic compound reaction takes place, the region of the bonding layer 11*b* surrounding the end 122 of the nanowire 12 turns into the IMC layer 12*i* having the tapered portion at the upward-climbing site.

The nanowire 15 may be disposed between the conductive element 11 and the conductive element 14. The nanowire 15 may have an end 151 (or a free end portion) and an end 152 (or a base portion) opposite to the end 151. The end 152 may be proximal to the surface 141 of the conductive element 14. The end 152 may be closer to the surface 141 of the conductive element 14 than the end 151.

The end 151 of the nanowire 15 may be laterally in contact with the end 121 of the nanowire 12 the IMC layer 15*i'*, and the IMC layer 15*i*. The end 151 of the nanowire 15 may be at an elevation relative to a surface (e.g., the surface 111) as compared to the end 121 and is between the end 121 and the end 122 of the nanowire 12 along an axis perpendicular or transverse to the surface (e.g., the surface 111 or 141). The end 121 of the nanowire 12 may be at an elevation between the end 151 and the end 152 of the nanowire 15 along the axis perpendicular or transverse to the surface (e.g., the surface 111 or 141). The nanowire 15 and the nanowire 12 may be arranged in staggered manner as shown. A lateral surface of the nanowire 15 may contact (such as directly contact) a lateral surface of the nanowire 12. The direct contact may allow transfer of heat by conduction.

The nanowire 15 may be similar to the nanowire 12. Some detailed descriptions may refer to the corresponding preceding paragraphs and are not repeated hereinafter for conciseness.

FIG. 1I illustrates an enlarged view of a nanowire bonding structure in accordance with some arrangements of the present disclosure. In some arrangements, the nanowire bonding structure in one or more figures herein may have an enlarged view as shown in FIG. 1I. The nanowire bonding structure in FIG. 1I is similar to the nanowire bonding structure in FIG. 1H except that the end 121 of the nanowire 12 may directly contact a surface the bonding layer 14b and the end 151 of the nanowire 15 may directly contact a surface the bonding layer 11b. In some arrangements, the end 151 of the nanowire 15 can be proximal to, or be in contact with, the bonding layer 11b rather than inserted or embedded into the bonding layer 11b. Similarly, the end 121 of the nanowire 12 can be proximal to, or be in contact with, the bonding layer 14b rather than inserted or embedded into the bonding layer 14b.

Figure 1J:
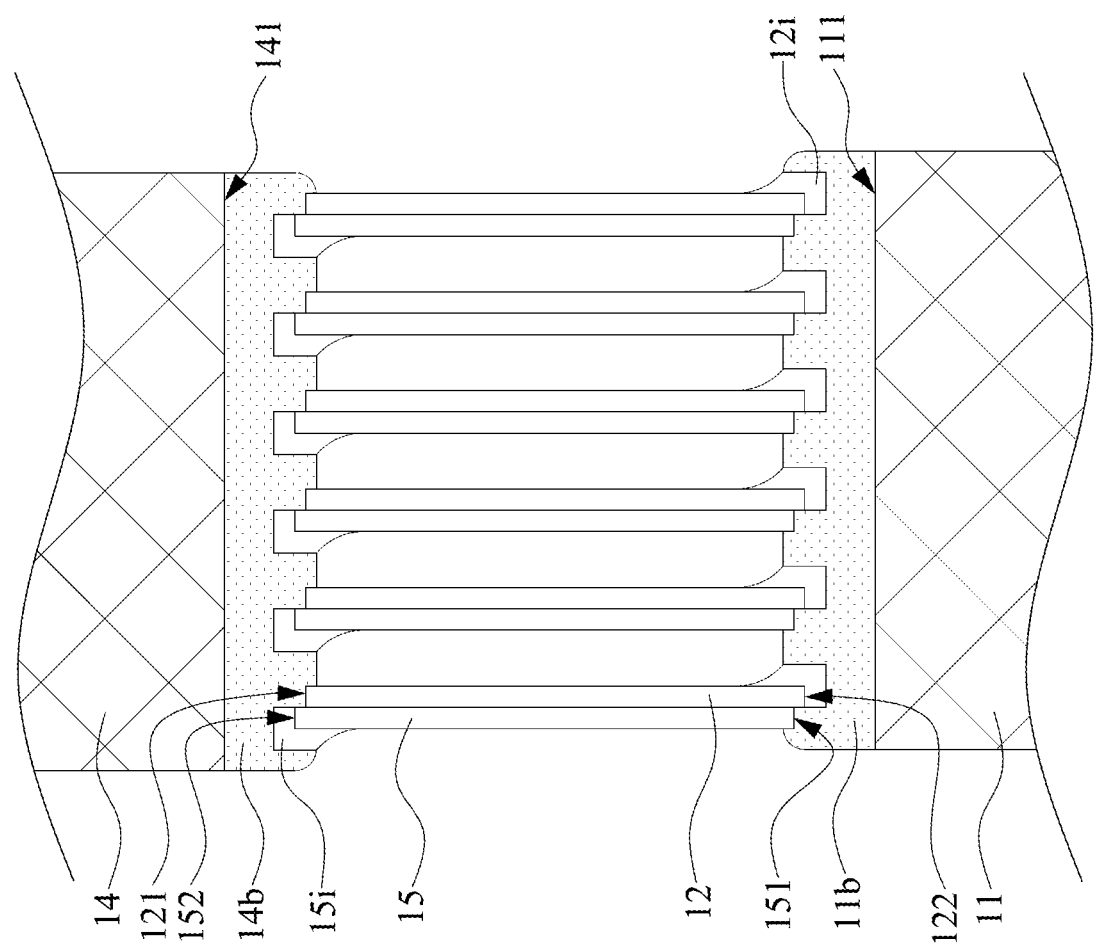
FIG. 1J illustrates an enlarged view of a nanowire bonding structure in accordance with some arrangements of the present disclosure.

FIG. 1J illustrates an enlarged view of a nanowire bonding structure in accordance with some arrangements of the present disclosure. In some arrangements, the nanowire bonding structure in one or more figures herein may have an enlarged view as shown in FIG. 1J. The nanowire bonding structure in FIG. 1J is similar to the nanowire bonding structure in FIG. 1H except that the end 121 of the nanowire 12 may penetrate the bonding layer 14b by a distance, and the end 151 of the nanowire 15 may penetrate the bonding layer 11b by a distance.

FIG. 2A illustrate a cross sectional view of a nanowire bonding structure 2a in accordance with some arrangements of the present disclosure. The nanowire bonding structure 2a in FIG. 2A is similar to the nanowire bonding structure 1 in FIG. 1A except for the differences described below.

The conductive elements 11 may include conductive pillars. The conductive elements 14 may include conductive pads. The length or height of the conductive elements 11 along a dimension perpendicular or transverse to a surface (e.g., the surface 101 or 131) may be greater than that of the conductive elements 14.

In some arrangements, the conductive elements 14 may include conductive pillars. The conductive elements 11 may include conductive pads. The length or height of the conductive elements 14 along a dimension perpendicular or transverse to a surface (e.g., the surface 101 or 131) may be greater than that of the conductive elements 11.

FIG. 2B illustrates a cross sectional view of a nanowire bonding structure 2b in accordance with some arrangements of the present disclosure. The nanowire bonding structure 2b in FIG. 2B is similar to the nanowire bonding structure 1 in FIG. 1A except for the differences described below.

The conductive elements 11 and 14 may include conductive pads. The length or height of the conductive elements 11 and 14 along a dimension perpendicular or transverse to a surface (e.g., the surface 101 or 131) may be less than 6 μm.

Figure 2C:
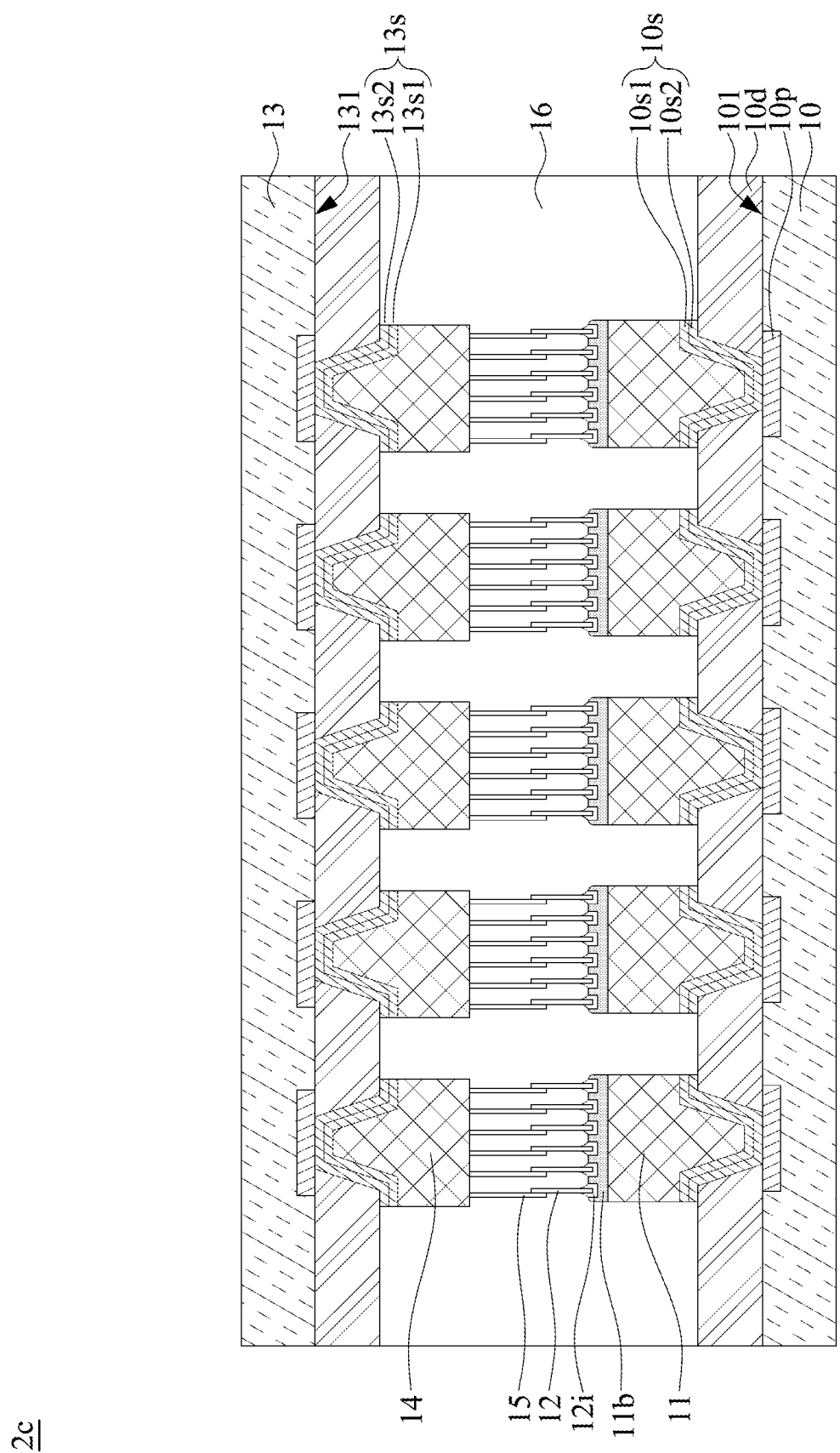
FIG. 2C illustrates a cross sectional view of a nanowire bonding structure in accordance with some arrangements of the present disclosure.

FIG. 2C illustrates a cross sectional view of a nanowire bonding structure 2c in accordance with some arrangements of the present disclosure. The nanowire bonding structure 2c in FIG. 2C is similar to the nanowire bonding structure 1 in FIG. 1A except for the differences described below.

The conductive elements 11 and 14 may include conductive pads. The nanowires 15 may be directly formed from the top surfaces of the conductive elements 14 through electroplating operations. The respective end of the nanowires 15 does not appear to "float" over but to "stand" on the conductive elements 14. Given that the electroplating operation involve direct deposition from the top surface of the conductive pads, respective end of the nanowires formed in such arrangement does not appear to "float" over but to "stand" on the conductive pillar. In such arrangements, no bonding layer and hence no IMC is present between the nanowires and the conductive pads.

Figure 3A:
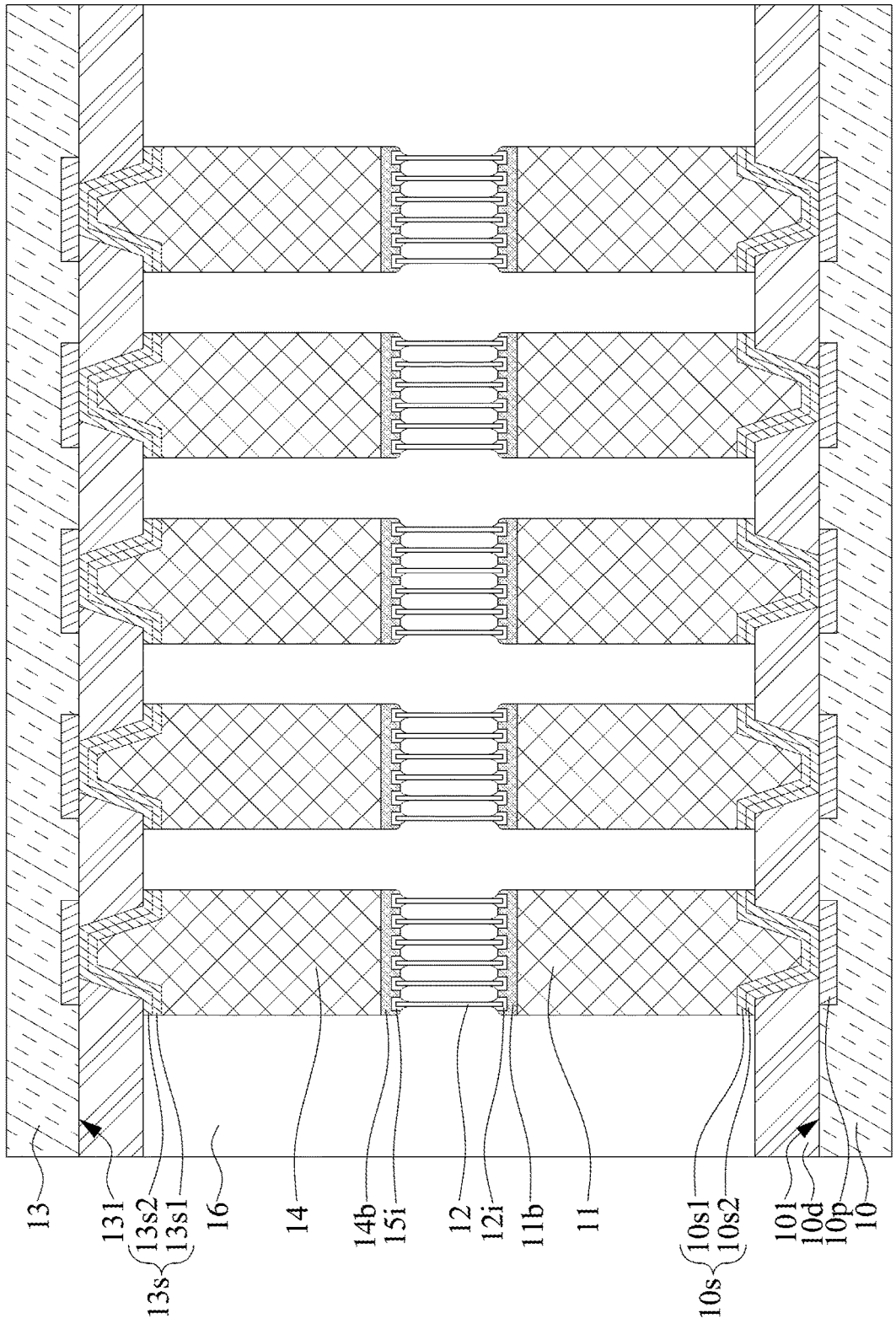
FIG. 3A illustrates a cross sectional view of a nanowire bonding structure in accordance with some arrangements of the present disclosure.

FIG. 3A illustrates a cross sectional view of a nanowire bonding structure 3a in accordance with some arrangements of the present disclosure. The nanowire bonding structure 3a in FIG. 3A is similar to the nanowire bonding structure 1 in FIG. 1A except for the differences described below.

The nanowires 15 associated with the conductive element 14 shown in some figures in this disclosure are not included in the nanowire bonding structure 3a in FIG. 3A. The substrate 10 may be electrically connected with the substrate 13 through the conductive elements 11 and 14 and the nanowires 12. That is, one set of nanowires 12 connect and is between the conductive elements 11 and 14.

The bonding layers 14b may be disposed between the conductive elements 14 and the nanowires 12. The bonding layers 14b may surround ends of the nanowires 12. The bonding layers 14b may at least partially surround lateral surfaces of the nanowires 12. In FIG. 3A, the base portion of the nanowire 12 is the end proximal to the top surface of the conductive element 11. The base portion of the nanowire 12 is brought into contact with the top surface of the conductive element 11 by the temporary carrier during the mass transfer operation. Similarly, the free end portion of the nanowire 12 is the end proximal to the bottom surface of the conductive element 14 and distal to the top surface of the conductive element 11. The free end portion of the nanowire 12 illustrated in FIG. 3A may not be clearly identifiable compared to the base portion for reasons disclosed herein. As discussed herein for example relative to FIG. 1D and FIG. 1E, given that the free end portions of the nanowires 12 can be tangled with each other and may not in certain known locations corresponding to the respective base portion of said nanowires 12, the free end portion of the nanowire 12 depicted in FIG. 3A can possess various different and random shapes or geometries. For example, the free end portion of the nanowire 12 can be a curved nanowire segment that is embedded or bonded in the bonding layer 14b and forming the associated IMC layer 15i.

In some arrangements, the bonding layers 14b may be configured to bond, adhere, or secure the free end portions of the nanowires 12 proximal to the bottom surfaces of the conductive elements 14.

Figure 3B:
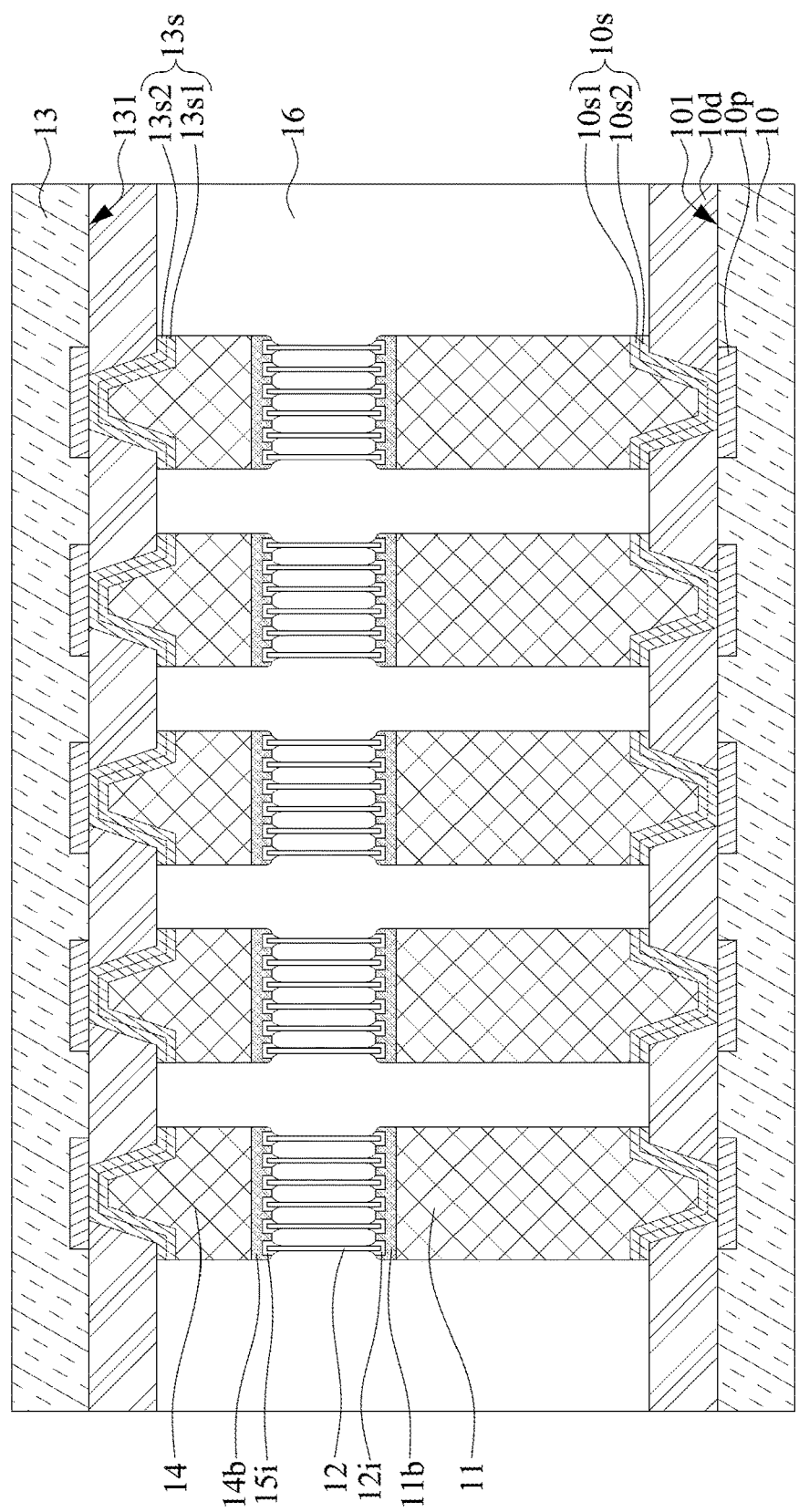
FIG. 3B illustrates a cross sectional view of a nanowire bonding structure in accordance with some arrangements of the present disclosure.

FIG. 3B illustrates a cross sectional view of a nanowire bonding structure 3b in accordance with some arrangements of the present disclosure. The nanowire bonding structure 3b in FIG. 3B is similar to the nanowire bonding structure 3a in FIG. 3A except for the differences described below.

The conductive elements 11 may include conductive pillars. The conductive elements 14 may include conductive pads. The length or height of the conductive elements 11 along a dimension perpendicular or transverse to a surface (e.g., the surface 101 or 131) may be greater than that of the conductive elements 14.

In some arrangements, the conductive elements 14 may include conductive pillars. The conductive elements 11 may include conductive pads. The length or height of the conductive elements 14 along a dimension perpendicular or transverse to a surface (e.g., the surface 101 or 131) may be greater than that of the conductive elements 11.

Figure 3C:
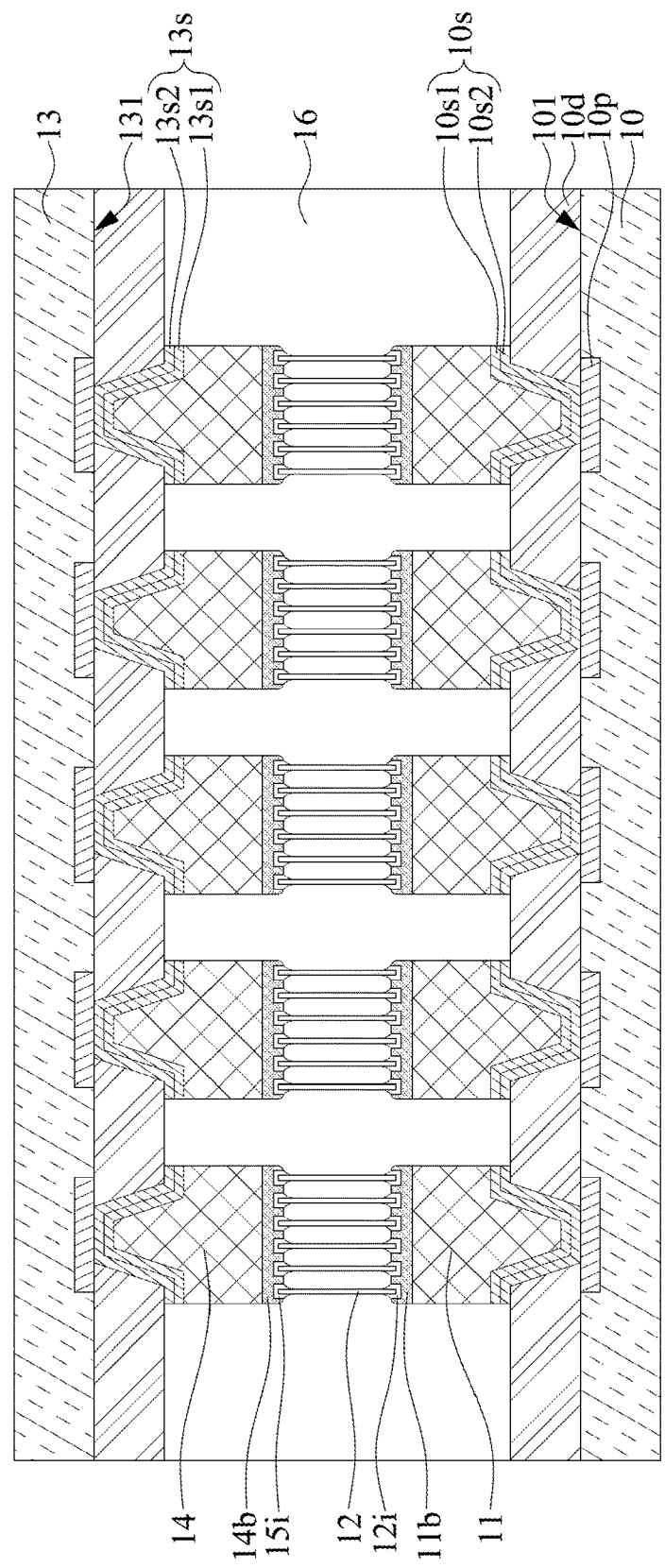
FIG. 3C illustrates a cross sectional view of a nanowire bonding structure in accordance with some arrangements of the present disclosure.

FIG. 3C illustrates a cross sectional view of a nanowire bonding structure 3c in accordance with some arrangements of the present disclosure. The nanowire bonding structure 3c in FIG. 3C is similar to the nanowire bonding structure 3a in FIG. 3A except for the differences described below.

The conductive elements 11 and 14 may include conductive pads. The length or height of the conductive elements 11 and 14 along a dimension perpendicular or transverse to a surface (e.g., the surface 101 or 131) may be less than 6 μm.

Figure 3D:
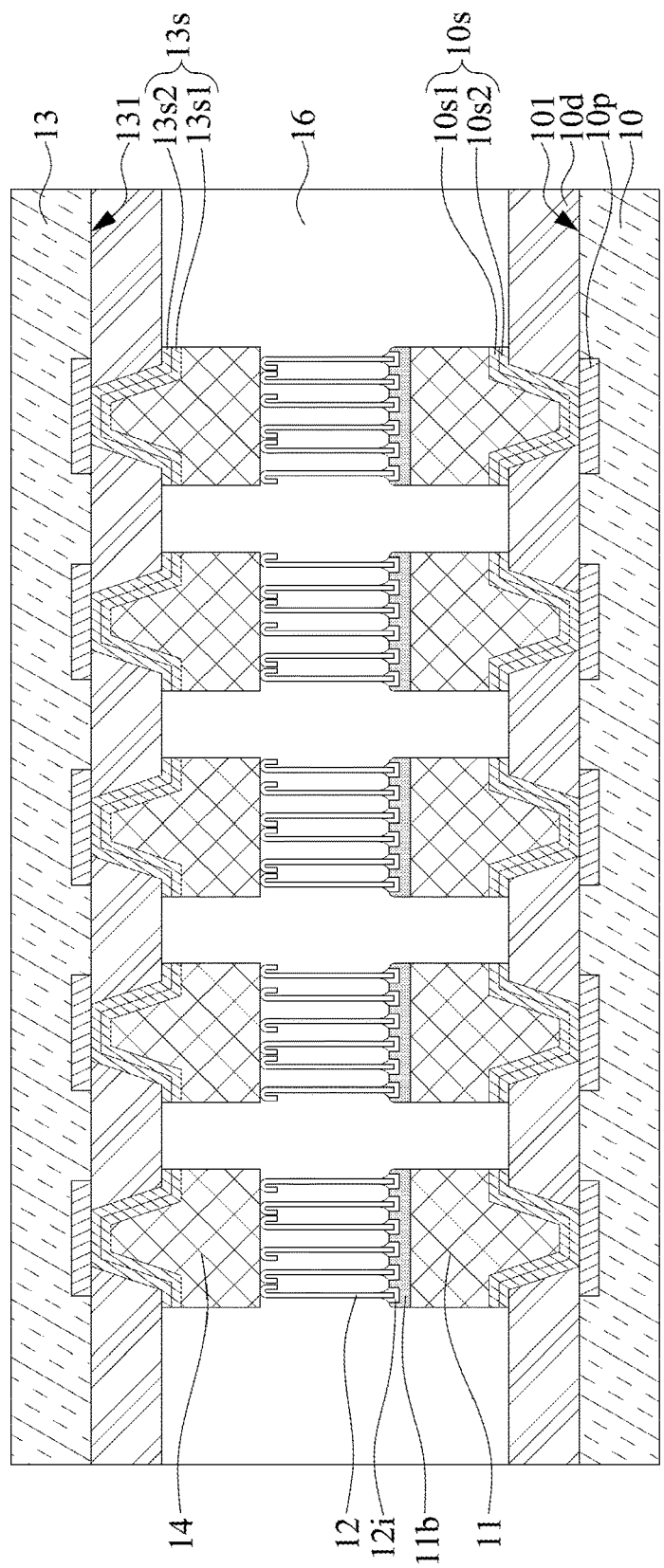
FIG. 3D illustrates a cross sectional view of a nanowire bonding structure in accordance with some arrangements of the present disclosure.

FIG. 3D illustrates a cross sectional view of a nanowire bonding structure 3d in accordance with some arrangements of the present disclosure. The nanowire bonding structure 3d in FIG. 3D is similar to the nanowire bonding structure 3a in FIG. 3A except for the differences described below.

The conductive elements 11 and 14 may include conductive pads. The bonding layers 14b may be omitted. The base portion of the nanowire 12 is brought into contact with the top surface of the conductive element 11 by the temporary carrier during the mass transfer operation. Similarly, the free end portion of the nanowire 12 is the end proximal to the bottom surface of the conductive element 14. The free end portion of the nanowire 12 illustrated in FIG. 3D may not be clearly identifiable compared to the base portion for reasons disclosed herein. As discussed herein for example relative to FIG. 1D and FIG. 1E, given that the free end portions of the nanowires 12 can be tangled with each other and may not in certain known locations corresponding to the respective base portion of said nanowires 12, the free end portion of the nanowire 12 depicted in FIG. 3D can possess various different and random shapes or geometries. For example, the free end portion of the nanowire 12 can be a curved nanowire segment that contacts the conductive elements 14.

Figure 3E:
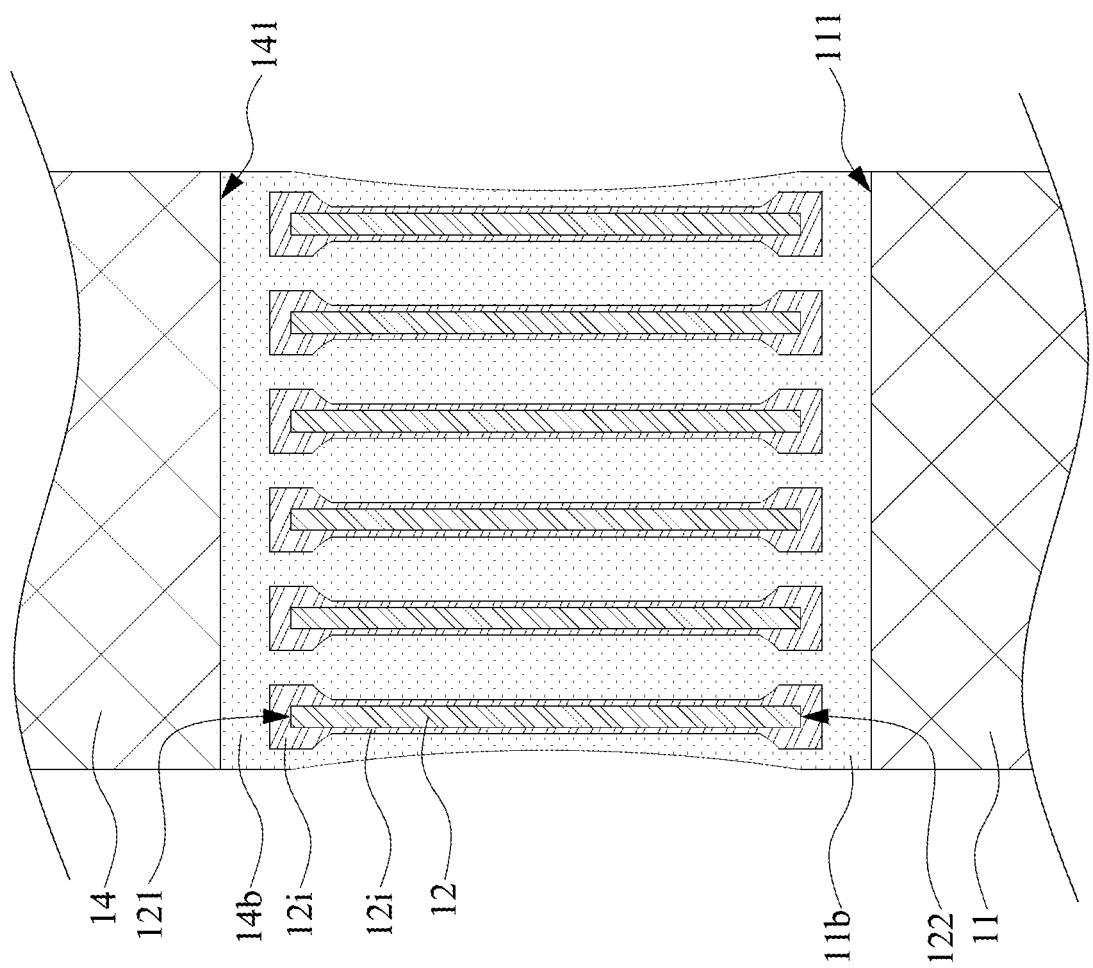
FIG. 3E illustrates an enlarged view of a nanowire bonding structure in accordance with some arrangements of the present disclosure.

FIG. 3E illustrates an enlarged view of a nanowire bonding structure in accordance with some arrangements of the present disclosure. In some arrangements, the nanowire bonding structure 3a in FIG. 3A may have an enlarged view as shown in FIG. 3E.

The end 122 (e.g., the base portion) of the nanowire 12 may be at least partially covered or encapsulated by the IMC layer 12i and further at least partially covered or encapsulated by the bonding layer 11b. The end 121 (e.g., the free end portion) of the nanowire 12 may be at least partially covered or encapsulated by the IMC layer 12i and further at least partially covered or encapsulated by the bonding layer 14b. The lateral surface of the nanowire 12 may be entirely surrounded or covered by the IMC layer 12i as additional bonding layer material is applied to form a continuous body between the bonding layers 11b, 14b and further in physical contact with the entire nanowires 12, as described for example relative to FIG. 1C.

In some arrangements, the lateral surface of the nanowire 12 may be partially exposed from the IMC layer 12i in the example in which the amount of the bonding layer material is not sufficient to form a continuous body between the bonding layers 11b, 14b, and hence only a portion of the nanowires 12 is in contact with the bonding layer material thus forming IMC layer 12i. The exposed portion of the lateral surface of the nanowire 12 may be surrounded, encapsulated, or covered by the underfill 16 shown in FIG. 3A.

FIG. 4A, FIG. 4B, FIG. 4C, FIG. 4D, FIG. 4E, FIG. 4F, FIG. 4G, FIG. and 4H illustrate a method for manufacturing a nanowire bonding structure in a cross sectional perspective, in accordance with some arrangements of the present disclosure. Certain simplification are made to the sake of clarity.

Referring to FIG. 4A, a temporary carrier 40 may be provided (e.g., manufactured). The temporary carrier 40 may include temporary or sacrificial base material such as silicon, polymer, polymer composite, metal, ceramic, glass, glass epoxy, beryllium oxide, or other suitable low-cost, rigid material or bulk semiconductor material for structural support. In some arrangements, the temporary carrier 40 may have a thickness of from 300 μm to 700 μm. In some arrangements, the temporary carrier 40 may include a weight of from 60 g to 140 g. In some arrangements, the thickness and the weight of the temporary carrier 40 can be determined from the critical buckling stress (MPa) of the nanowires in the mass transfer operation of FIG. 4E. In some arrangements, the critical buckling stress may be in a range of from 40 to 50 MPa.

An adhesive layer 41 may be disposed over the temporary carrier 40. In some arrangements, the adhesive layer 41 may include a conductive material, such as Cu, Au, Sn, Ag, Al, W, Ni, or other suitable materials. In some arrangements, the adhesive layer 41 may include sublayers, such as a sublayer including Cu and a sublayer including Ti. The adhesive layer 41 may also be referred to as a seed layer or a conductive layer herein.

A sacrificial layer 42 may be disposed or formed over the temporary carrier 40 and attached to the temporary carrier 40 through the adhesive layer 41. In some arrangements, the sacrificial layer 42 may include an aluminum foil or layer. In some arrangements, the sacrificial layer 42 may include an aluminum-containing foil or layer, such as 1050 aluminum alloy. In some arrangements, the sacrificial layer 42 may have a thickness of from 10 nm to 100 nm.

Figure 4B:
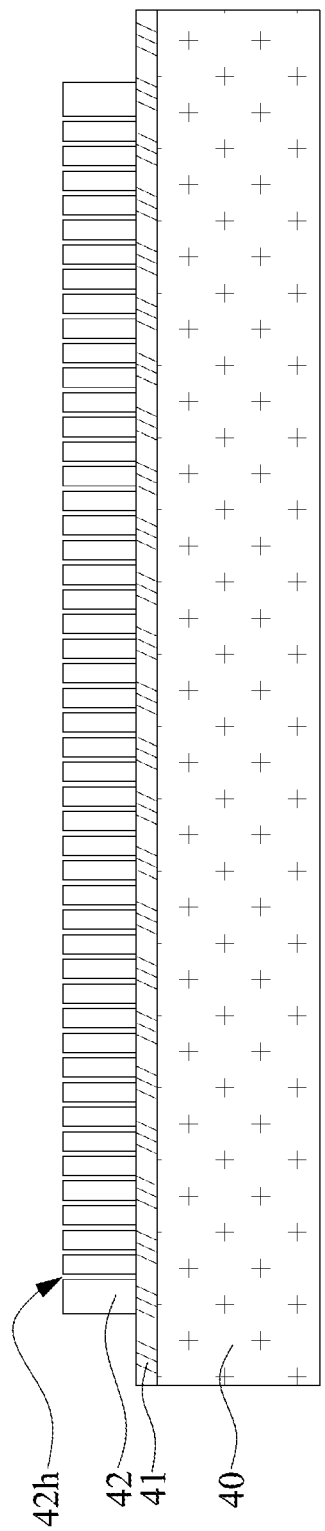

Referring to FIG. 4B, a plurality of pores 42h or percolated structure may be formed in the sacrificial layer 42. In some arrangements, an anodization operation may be performed to fabricate an AAO template with pore diameters ranging from 50 nm to 100 nm. In some arrangements, the porosity of the AAO template may be greater than 50%. In some arrangements, the pore density of the AAO template may be greater than $5.1E2$ ($\#/\mu m^2$).

In some arrangements, some or all of the pores 42h or percolated structure may penetrate the sacrificial layer 42. In some arrangements, some of the pores 42h may not penetrate the sacrificial layer 42. In some arrangements, the adhesive layer 41 may be exposed to the environment through the pores 42h.

For example, the anodizing procedure may be performed in the presence of an electrolyte, such as oxalic acid, sulfuric acid. The anodizing voltage may be within the range of 10V to 100V. The temperature may be within the range of 0° C. to 30° C., such as 5° C. The anodizing may last for about 1 minutes to 60 minutes, such as 2 minutes.

Figure 4C:
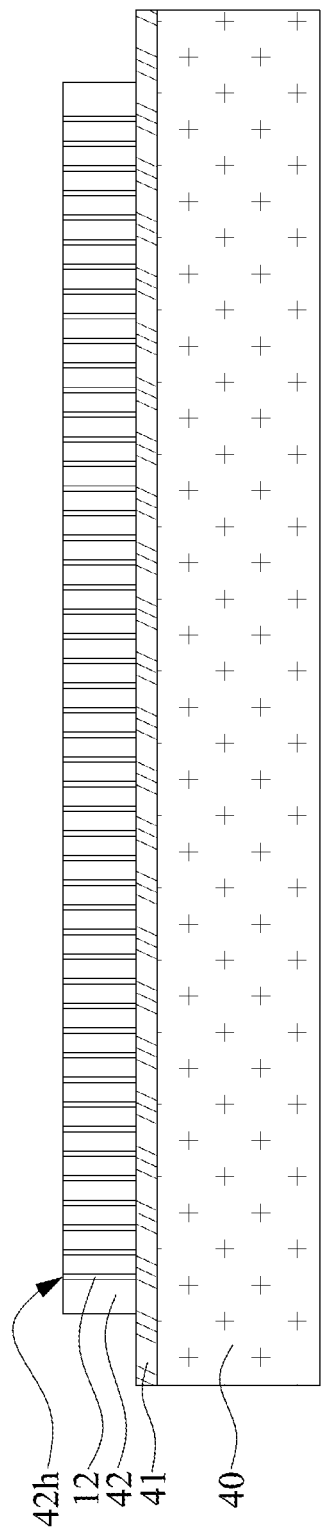

Referring to FIG. 4C, the nanowires 12 may be formed in the pores 42h or percolated structure of the sacrificial layer 42. In some arrangements, the nanowires 12 may be formed through an electroplating operation. In some arrangements, the nanowires 12 may be formed by electroplating with the aid of sacrificial layer 42. The pores 42h or percolated structure in the sacrificial layer 42 exposes a portion of the surface of the adhesive layer 41 (or the seed layer or conductive layer referred herein) to the plating solution, hence providing an eletroplating setting for the nanowire growth. For examples, the nanowires 12 may be formed by plating copper (Cu), gold (Au), tin (Sn), silver (Ag), aluminum (Al), tungsten (W), nickel (Ni), or another conductive material. In some arrangements, respective bottom end of some or all of the nanowires 12 may contact the adhesive layer 41.

Figure 4D:
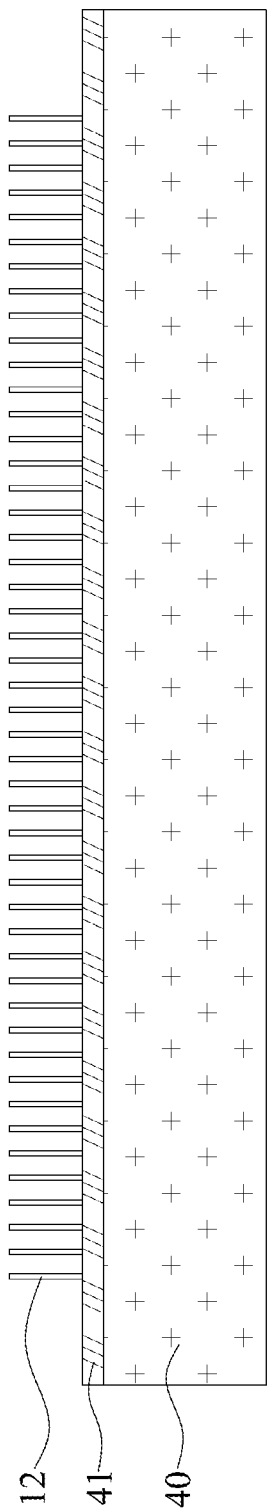

Referring to FIG. 4D, the sacrificial layer 42 may be removed or dissolved by, for example, immersing the sacrificial layer 42 in a strong acid. In some arrangements, chromic acid ($H_2CrO_4$) or an acid solution having pH lower than 3.0 may be the strong acid referred herein. After the sacrificial layer 42 is removed or dissolved, at least the respective end proximal to the adhesive layer 41 of a cluster (or array) of nanowires 12 are aligned longitudinally along a direction perpendicular to the surface of the temporary carrier 40.

Figure 4E:
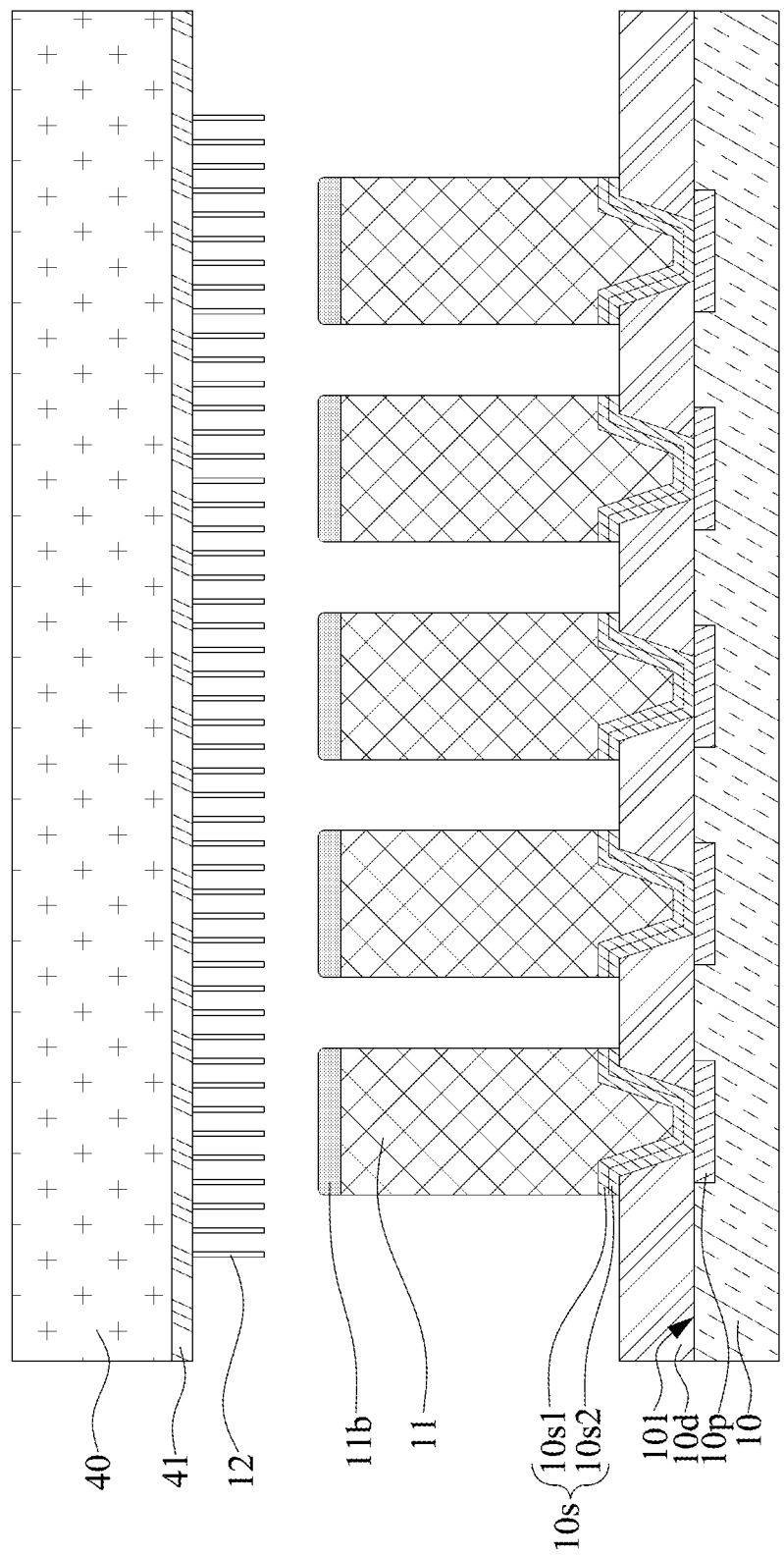

Referring to FIG. 4E, the substrate 10 having the seed layer 10s and the conductive elements 11 may be provided. The bonding layers 11b may be electroplated over top surfaces of the conductive elements 11 with gallium (Ga), indium (In), tin (Sn), bismuth (Bi), or other conductive materials. The nanowires 12 carried by the temporary carrier 40 may be brought into contact with the bonding layers 11b under a reflowable state. In the example in which the bonding layers 11b are made of soldering material, a temperature of the substrate 10 can be brought to a range of 230° C.-260° C., whereas then the bonding layers 11b are made of Ga, Ga-containing material, the temperature of the substrate 10 can be keep at room-temperature (e.g., 25° C. to 35° C.) in order to achieve the reflowable state to further facilitate the mass transfer of the nanowires 12.

Given the description to FIG. 4E, no lithography process is needed to define the locations on the conductive element 11 to be formed with nanowires. Therefore, the pitch of the conductive elements 11 can be reduced regardless of the limitation imposed by the corresponding lithography operations. In some arrangements, the pitch of the conductive elements 11 may be less than 30 μm, such as 20 μm, 10 μm, 9 μm, etc.

Figure 4F:
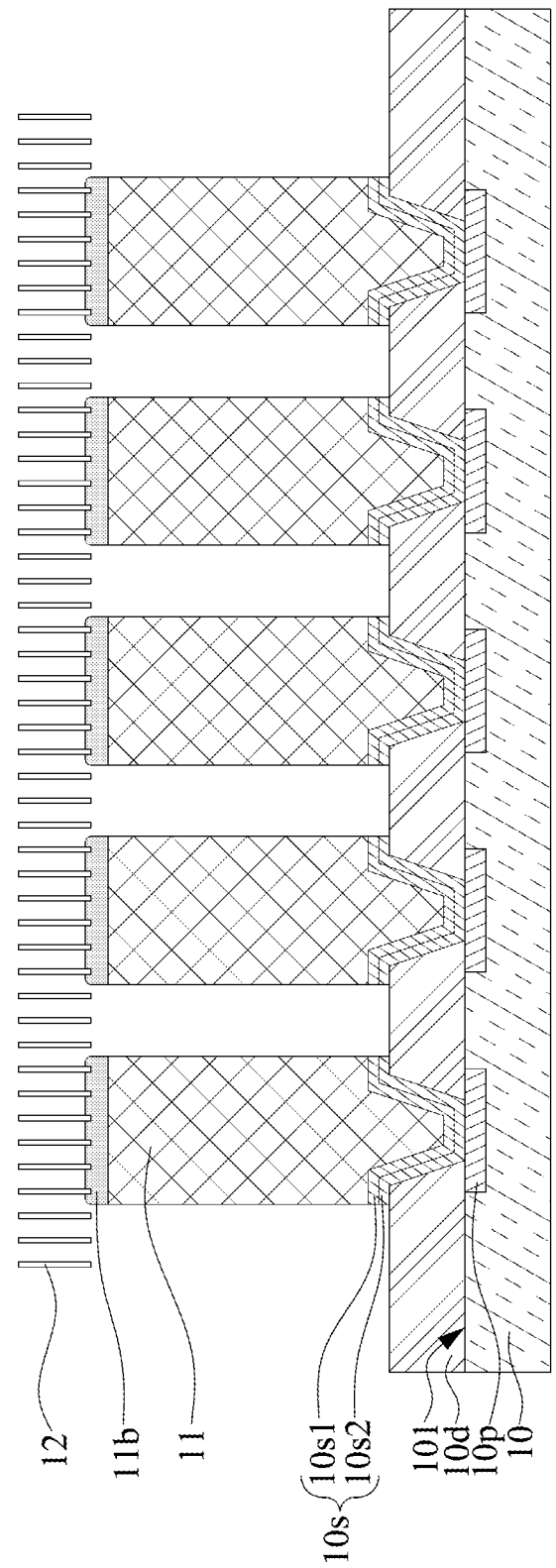

Referring to FIG. 4F, the z-height control across the temporary carrier 40 can be included in the mass transfer operation. The nanowires 12 may be brought into contact with the bonding layers 11b under the reflowable state. A bonding strength between the bonding layers 11b and the corresponding end of the nanowires 12 in contact with the bonding layer material is established. Especially the IMC layer (not shown in FIG. 4F) formed at the interface between the nanowires 12 and the bonding layer 11b provides the required bonding strength. Such bonding strength is sufficient to successfully transfer the nanowires 12 from the temporary carrier 40 to the top surfaces of the conductive elements 11 in a mass transfer operation.

The temporary carrier 40 may be removed by, for example, laser debonding operation via an irradiation of a laser through the temporary substrate 40 transparent to such irradiation and to change the viscosity or adhesibility of the adhesive layer 41. The nanowires 12 having one end already established sufficient bonding strength to the bonding layer 11b may be transferred to the conductive element 11 after the temporary carrier debonding operation. In some embodiments, removing the temporary substrate 40 further include an operation of removing the adhesive layer 41 (or the seed layer or the conductive layer) by an etching operation. Such etching operation may selectively remove the adhesive layer 41 but left the nanowires 12 substantially intact. The IMC layer formed in FIG. 4F in some arrangement can be composed of $CuGa_2$, which has a melting temperature of about 254° C., and being compatible to the thermal budget of the subsequent metal-to-metal bonding operations having a bonding temperature of about 200° C. Thus, an externally-formed low temperature bonding structure (e.g., the nanowires) is transferred to the conductive layer after the first conductive layer is formed on the first conductive element. In some examples, the externally-formed nanowires 12 are concurrently transferred to the plurality of bonding layer 11b on the conductive elements 11. Through the contact between the externally-formed nanowires 12 and the bonding layer 11b, IMC layer is formed at the contact interface, providing sufficient bonding force to transfer the externally-formed nanowires 12 altogether from the temporary substrate 40 to the conductive elements 11.

Figure 4G:
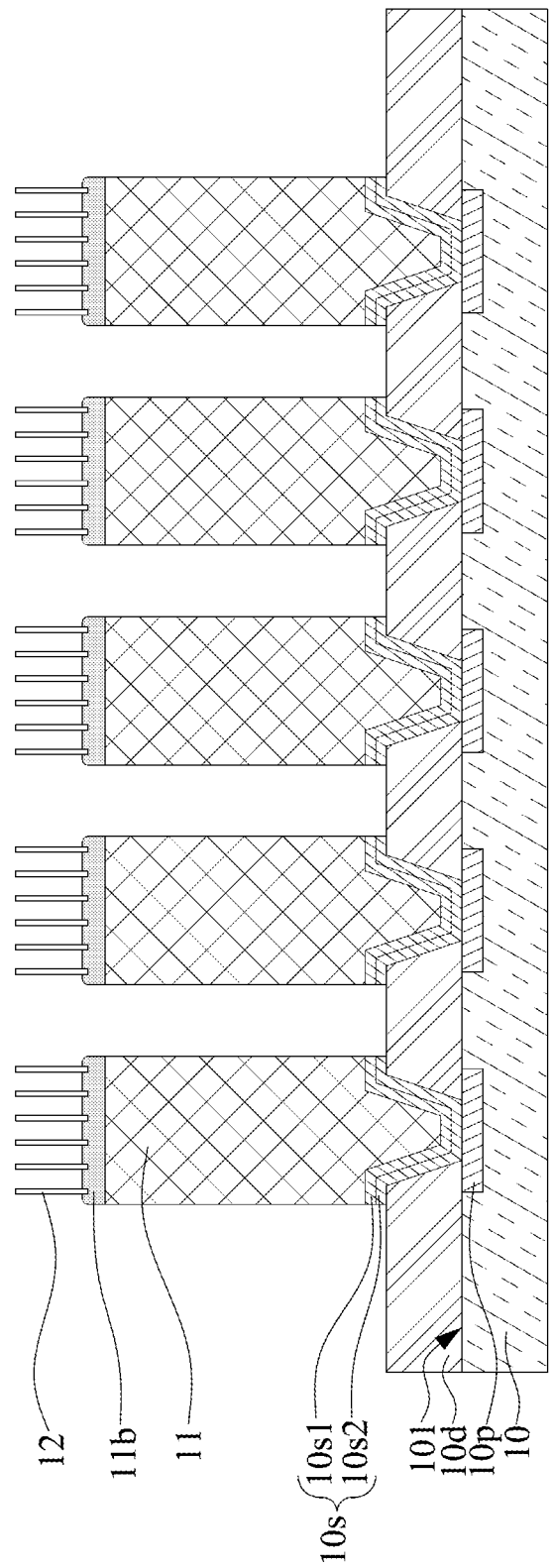

Referring to FIG. 4G, nanowires 12 not bonded over the bonding layers 11b may fall out. In some arrangements, under a well control of Z-height during the mass transfer operation, respective end of the nanowires 12 proximal to the top surface of the conductive element 11 may stand substantially perpendicular thereon.

Figure 4H:
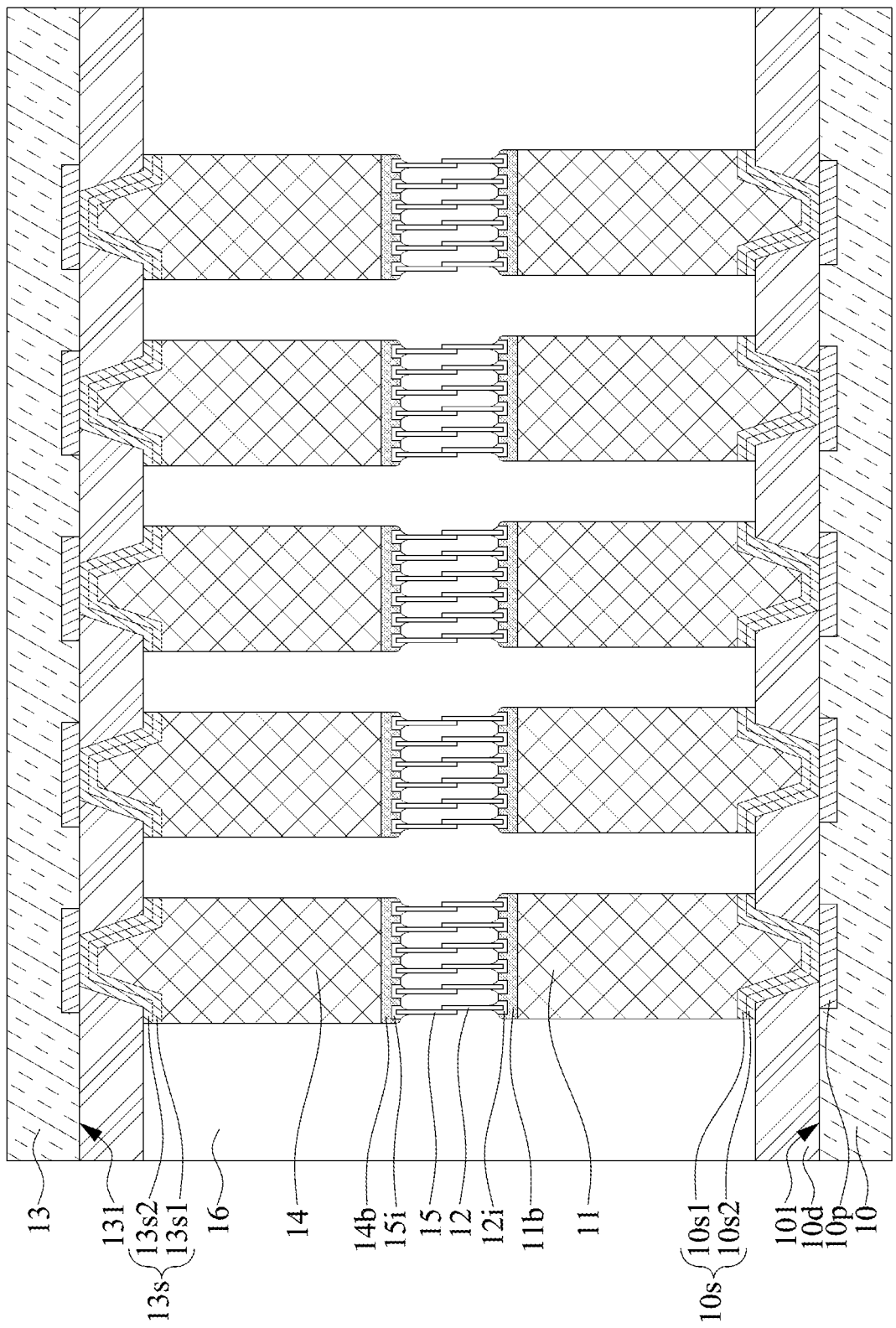

Referring to FIG. 4H, the operations illustrated in FIGS. 4A to 4G may be repeated to mass transfer another clusters of nanowires 15 to the conductive elements 14 on the other substrate 13. In some arrangements, the nanowires 15 and the nanowires 12 may be transferred from the temporary carrier 40 to the conductive elements 14 and the conductive elements 11 respectively in the same operations. For example, the temporary carrier 40 may carry several clusters of nanowires to be transferred to conductive elements on different substrates. The substrate 13 and the substrate 10 may be bonded through the nanowires 15 and the nanowires 12 by using an alignment machine. In some arrangements, the bonding temperature utilized to bond the opposite clusters of nanowires 12, 15 may be lower than the melting point of the IMC layer 12i and can be about 200° C.

In some arrangements, as shown in FIG. 1C, the bonding layers 11b and/or 14b may become soften or flowable, climbing onto the lateral surfaces of the nanowires 12 and 15. The bonding layer 11b may be connected with the bonding layer 14b when additional amount of bonding layer material is applied, forming a continuous body of the bonding layer in the bonding structure 17. In some arrangements, a portion of the bonding structure 17 contacting the nanowires 12 and 15 may form an IMC with the nanowires 12 and 15. In some arrangements, a portion of the bonding structure 17 may remain as gallium or other reflowable material.

In some arrangements, an additional bonding layer material (e.g., liquid gallium or gallium-containing material) may be applied after the mass transfer of the nanowire clusters from the temporary carrier and prior to the metal-metal bonding operation. Under this condition, the bonding temperature may be less than about 150° C. Then, the underfill 16 may be formed between the substrate 10 and the substrate 13 to surround, cover, or encapsulate the conductive elements 11 and 14 and the nanowires 12 and 15.

In some arrangements, the temperature in the subsequent operations may be kept under the melting temperature of the IMC layers 12i and 15i to prevent the IMC layers 12i and 15i from melting. For example, the melting temperature of the $CuGa_2$ IMC of copper (Cu) and gallium (Ga) may be about 254° C. The temperature in the subsequent operations may be kept under about 254° C.

In some arrangements, an aluminum foil is directly formed on conductive pillars (for example, copper (Cu) pillars). An anodization operation is performed on the aluminum foil to fabricate an AAO template with porous or percolated structure. A patterned photoresist is used to block out regions on the AAO template not intended to form nanowires. Then, an electrodeposition operation is performed to fill the porous or percolated AAO, thus directly forming nanowires on the conductive pillars. Afterwards, the photoresist and the AAO template are removed from the surface having the conductive pillars.

However, problems of such manufacturing process include: (1) thick aluminum foil (e.g., greater than 10 µm) is preferred in respect to serving as an AAO template, however, thick aluminum foil is prone to delaminate from the underlying substrate, (2) strong acid (e.g., pH<3) is exploited to carry out the anodization procedure, and such chemical may limit the workability of other components such as the underlying structure, (3) the patterning the photoresist to form small and dense openings may be problematic because the diameter and the pitch of the conductive pillars are further reduced, and (4) strong acid (e.g., pH<3) is again used to remove the AAO template after metal (e.g., copper) electrodeposition, which may affect the structural integrity of the just-formed nanowires.

According to some arrangements of the present disclosure, by forming the sacrificial layer 42 over the temporary carrier 40, the sacrificial layer 42 may have a thickness of from 10 nm to 100 nm (i.e., far less than 10 µm). Therefore, the risk of delamination can be reduced.

The AAO template can be formed over the temporary carrier 40. Therefore, the strong acid used in the anodization process or the strong acid used to remove the AAO template may not compromise the workability of other components such as the underlying structure or the structural integrity of the just-formed nanowires.

In addition, as stated, since no lithography process has been taken place to define the locations to be formed with nanowires, the diameter and the pitch of the conductive elements 11 will no longer be limited by the corresponding lithography operation. Fine-pitch conductive elements 11 may be provided with nanowire clusters or nanowire arrays in the same operation.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range.

Ranges can be expressed herein as from one endpoint to another endpoint or between two endpoints. All ranges disclosed herein are inclusive of the endpoints unless specified otherwise. The term "substantially coplanar" can refer to two surfaces within micrometers (µm) of lying along the same plane, such as within 10 µm, within 5 µm, within 1 µm, or within 0.5 µm of lying along the same plane. When referring to numerical values or characteristics as "substantially" the same, the term can refer to the values lying within ±10%, ±5%, ±1%, or ±0.5% of an average of the values.

The foregoing outlines features of several arrangements and detailed aspects of the present disclosure. The arrangements described in the present disclosure may be readily used as a basis for designing or modifying other processes and structures for carrying out the same or similar purposes and/or achieving the same or similar advantages of the arrangements introduced herein. Such equivalent constructions do not depart from the spirit and scope of the present disclosure, and various changes, substitutions, and alterations may be made without departing from the spirit and scope of the present disclosure.

What is claimed is:

1. A package structure, comprising:
a substrate including a conductive element;
a plurality of wires having a surface area through which heat of the conductive element can be dissipated, lowering a bonding temperature of the conductive element; and
a conductive layer disposed between the conductive element of the substrate and the plurality of wires, wherein the conductive layer attaches the plurality of wires over the conductive element,
wherein a lateral surface of the conductive layer protrudes from a lateral surface of the conductive element.

2. The package structure of claim 1, wherein one of the plurality of wires has a first end and a second end opposite to the first end, wherein the first end is embedded into the conductive layer, and the second end is exposed from the conductive layer.

3. The package structure of claim 2, further comprising: a first intermetallic compound (IMC) layer disposed on the first end of the one of the plurality of wires, and the first IMC layer is between the one of the plurality of wires and the conductive layer.

4. The package structure of claim 3, wherein the first IMC layer and the conductive element are spaced from each other by a distance.

5. The package structure of claim 3, further comprising: a second IMC layer disposed between the conductive element and the conductive layer, wherein the conductive layer is disposed between the first IMC layer and the second IMC layer.

6. The package structure of claim 1, wherein each of the plurality of wires has a first end embedded into the conductive layer, and respective distances between each of the first ends of the plurality of wires and the conductive element are different.

7. The package structure of claim 1, wherein each of the plurality of wires has a first end embedded into the conductive layer, and a plurality of the first ends are substantially parallel to each other.

8. The package structure of claim 1, wherein a melting point of the conductive layer is lower than a melting point of the plurality of wires.

9. The package structure of claim 8, further comprising: a first IMC layer disposed between the plurality of wires and the conductive layer, wherein a melting point of the first IMC layer is greater than the melting point of the conductive layer.

10. The package structure of claim 1, wherein the conductive layer surrounds the lateral surface of the conductive element.

11. A package structure, comprising:
a first conductive element;
a first low temperature bonding structure disposed over the first conductive element and connecting the first conductive element with a second conductive element; and
a first conductive inter layer bonding the first conductive element to the first low temperature bonding structure and spaced apart from the second conductive element,
wherein the first low temperature bonding structure has a non-entangled portion in contact with the first conductive inter layer and an entangled portion outside of the first conductive inter layer.

12. The package structure of claim 11, wherein the first low temperature bonding structure comprises a first nanowire.

13. The package structure of claim 12, wherein the first conductive inter layer is spaced apart from the second conductive element by an underfill.

14. The package structure of claim 13, wherein the non-entangled portion of the first nanowire is embedded into the first conductive inter layer and the underfill is free from contacting the non-entangled portion of the first nanowire.

15. The package structure of claim 12, wherein the first nanowire contacts the second conductive element.

16. The package structure of claim 11, further comprising:
a second low temperature bonding structure disposed between the first conductive inter layer and the second conductive element, wherein the second low temperature bonding structure is electrically connected to the first low temperature bonding structure; and
a second conductive inter layer bonding the second conductive element to the second low temperature bonding structure and spaced apart from the first conductive element,
wherein the second low temperature bonding structure has a non-entangled portion in contact with the second conductive inter layer and an entangled portion outside of the second conductive inter layer.

17. The package structure of claim 16, wherein the first conductive inter layer is spaced apart from the second conductive inter layer by an underfill.

18. The package structure of claim 17, wherein the second low temperature bonding structure comprises a second nanowire.

19. The package structure of claim 18, wherein the non-entangled portion of the second nanowire is embedded into the second conductive inter layer and the underfill is free from contacting the non-entangled portion of the second nanowire.

* * * * *